(12) United States Patent
Chen et al.

(10) Patent No.: US 12,519,020 B2
(45) Date of Patent: Jan. 6, 2026

(54) SEMICONDUCTOR PROCESSING TOOL AND METHODS OF OPERATION

(71) Applicant: Taiwan Semiconductor Manufacturing Company, Ltd., Hsinchu (TW)

(72) Inventors: I-Nan. Chen, Taipei (TW); Kuo-Ming Wu, Zhubei (TW); Ming-Che Lee, Tainan (TW); Hau-Yi Hsiao, Chiayi (TW); Yung-Lung Lin, Taichung (TW); Che Wei Yang, New Taipei (TW); Sheng-Chau Chen, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 805 days.

(21) Appl. No.: 17/807,640

(22) Filed: Jun. 17, 2022

(65) Prior Publication Data
US 2023/0411227 A1    Dec. 21, 2023

(51) Int. Cl.
*H01L 21/66*    (2006.01)
*G05B 19/416*    (2006.01)
*H01L 21/3105*    (2006.01)

(52) U.S. Cl.
CPC .......... *H01L 22/26* (2013.01); *G05B 19/416* (2013.01); *H01L 21/31053* (2013.01); *G05B 2219/45232* (2013.01)

(58) Field of Classification Search
CPC ...................................... H01L 22/26
See application file for complete search history.

(56) References Cited

U.S. PATENT DOCUMENTS

| | | | | |
|---|---|---|---|---|
| 4,899,055 A | * | 2/1990 | Adams | G01B 11/0633 356/318 |
| 5,196,353 A | * | 3/1993 | Sandhu | H01L 21/31053 438/692 |
| 5,643,060 A | * | 7/1997 | Sandhu | B24B 37/12 451/7 |
| 5,658,183 A | * | 8/1997 | Sandhu | B23Q 15/013 451/6 |
| 5,665,656 A | * | 9/1997 | Jairath | B24D 13/12 438/692 |
| 5,735,731 A | * | 4/1998 | Lee | B24D 9/00 451/388 |
| 5,868,857 A | * | 2/1999 | Moinpour | B08B 1/30 15/97.1 |

(Continued)

*Primary Examiner* — William A Harriston
(74) *Attorney, Agent, or Firm* — Harrity & Harrity, LLP

(57) ABSTRACT

Some implementations described herein provide techniques and apparatuses for polishing a perimeter region of a semiconductor substrate so that a roll-off profile at or near the perimeter region of the semiconductor substrate satisfies a threshold. The described implementations include depositing a first layer of a first oxide material across the semiconductor substrate followed by depositing a second layer of a second oxide material over the first layer of the first oxide material and around a perimeter region of the semiconductor substrate. The described implementations further include polishing the second layer of the second oxide material over the perimeter region using a chemical mechanical planarization tool including one or more ring-shaped polishing pads oriented vertically over the perimeter region.

20 Claims, 17 Drawing Sheets

(56) References Cited

U.S. PATENT DOCUMENTS

| | | | | |
|---|---|---|---|---|
| 5,957,750 A * | 9/1999 | Brunelli | ............... | B24B 49/14 451/21 |
| 6,159,075 A * | 12/2000 | Zhang | ............... | B24B 37/042 451/287 |
| 6,267,649 B1 * | 7/2001 | Lai | ............... | B24B 9/065 451/41 |
| 6,292,265 B1 * | 9/2001 | Finarov | ............... | H01L 22/34 451/6 |
| 6,334,807 B1 * | 1/2002 | Lebel | ............... | B24B 49/04 451/6 |
| 6,352,466 B1 * | 3/2002 | Moore | ............... | B24B 49/00 451/6 |
| 6,475,293 B1 * | 11/2002 | Moinpour | ............... | B24B 9/065 15/97.1 |
| 6,476,921 B1 * | 11/2002 | Saka | ............... | B24B 37/013 451/6 |
| 6,540,841 B1 * | 4/2003 | Roy | ............... | B08B 1/34 134/6 |
| 6,561,881 B2 * | 5/2003 | Jeong | ............... | B24B 41/068 451/285 |
| 6,872,662 B1 * | 3/2005 | Hocheng | ............... | B24B 49/12 438/959 |
| 7,993,485 B2 * | 8/2011 | Wasinger | ............... | B24B 21/004 156/345.12 |
| 12,138,743 B2 * | 11/2024 | Kang | ............... | B24B 41/06 |
| 2002/0132566 A1 * | 9/2002 | Jeong | ............... | B24B 37/30 451/57 |
| 2002/0159626 A1 * | 10/2002 | Shiomi | ............... | G06T 7/0004 382/145 |
| 2003/0143930 A1 * | 7/2003 | Khoury | ............... | B24D 13/10 451/41 |
| 2004/0000326 A1 * | 1/2004 | Ziemins | ............... | H01L 21/02052 257/E21.228 |
| 2005/0048875 A1 * | 3/2005 | Koo | ............... | B24B 49/10 451/7 |
| 2005/0118839 A1 * | 6/2005 | Chen | ............... | B24B 49/12 257/E21.244 |
| 2005/0244047 A1 * | 11/2005 | Kern | ............... | G06T 7/0004 382/141 |
| 2006/0062897 A1 * | 3/2006 | Gu | ............... | C23C 18/1675 427/8 |
| 2006/0243304 A1 * | 11/2006 | Hsu | ............... | H01L 21/67046 134/21 |
| 2007/0066192 A1 * | 3/2007 | Kumahara | ............... | B24B 53/053 451/178 |
| 2008/0188167 A1 * | 8/2008 | Ishii | ............... | B24B 9/065 451/307 |
| 2011/0021115 A1 * | 1/2011 | Oh | ............... | B24B 37/04 451/10 |
| 2011/0294406 A1 * | 12/2011 | An | ............... | B24B 37/02 451/259 |
| 2012/0270477 A1 * | 10/2012 | Nangoy | ............... | B24B 53/017 451/443 |
| 2014/0087627 A1 * | 3/2014 | Togawa | ............... | B24B 9/065 451/64 |
| 2015/0056891 A1 * | 2/2015 | Matsuo | ............... | B24B 53/017 356/600 |
| 2017/0274495 A1 * | 9/2017 | Lau | ............... | B24B 37/10 |
| 2018/0250788 A1 * | 9/2018 | Lau | ............... | H01L 21/31053 |
| 2019/0299354 A1 * | 10/2019 | Ando | ............... | H01L 21/304 |
| 2023/0211449 A1 * | 7/2023 | Satomura | ............... | B24B 37/02 451/173 |

* cited by examiner

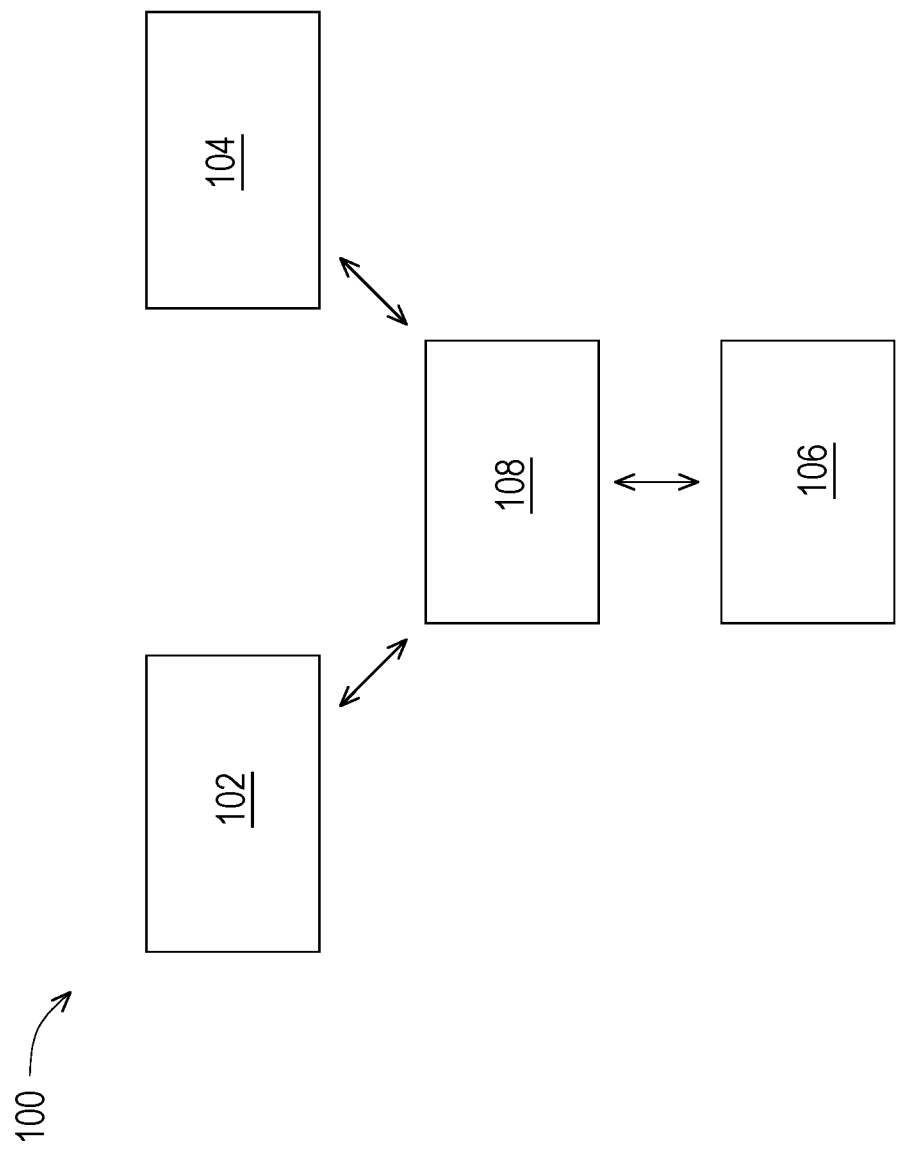

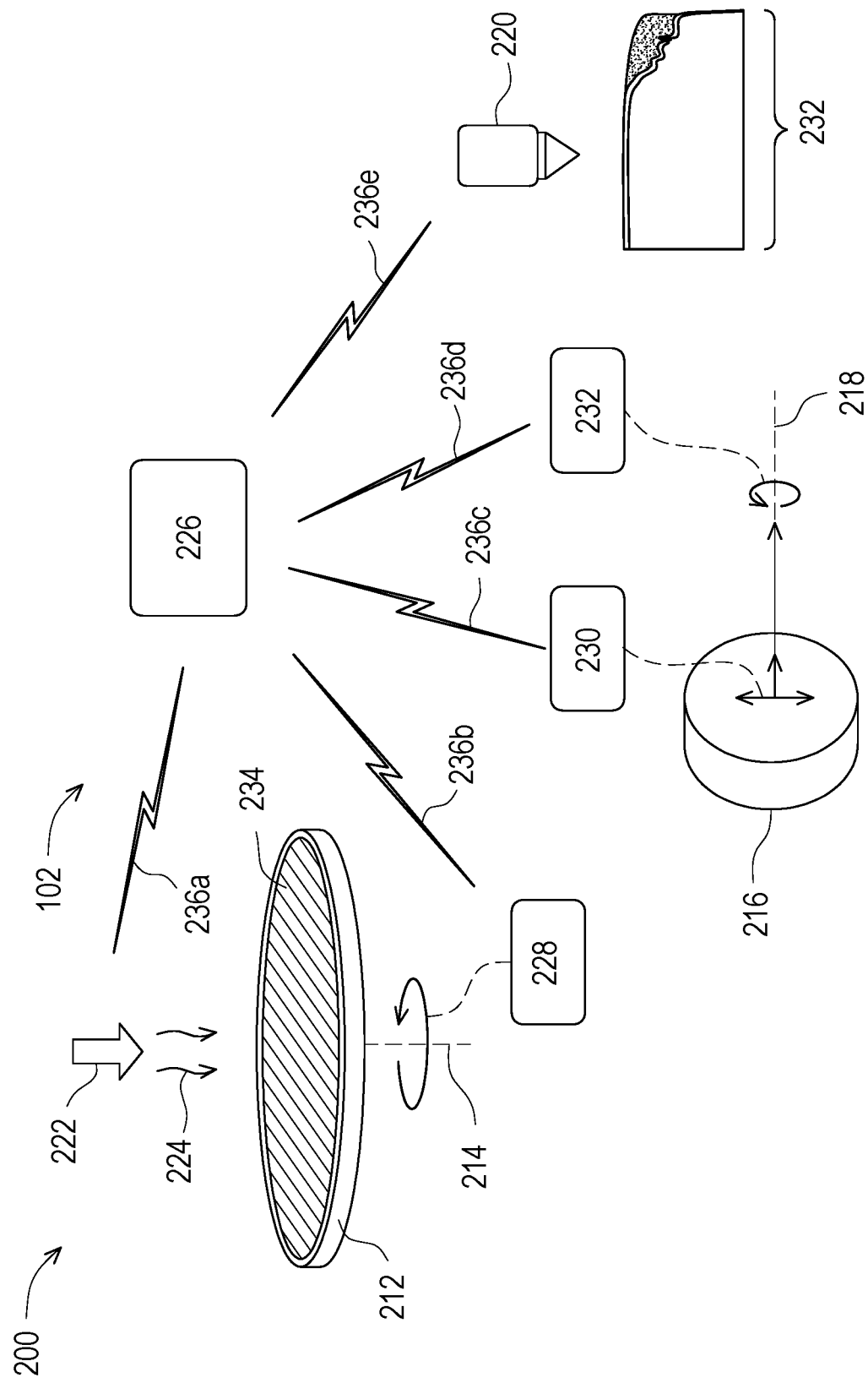

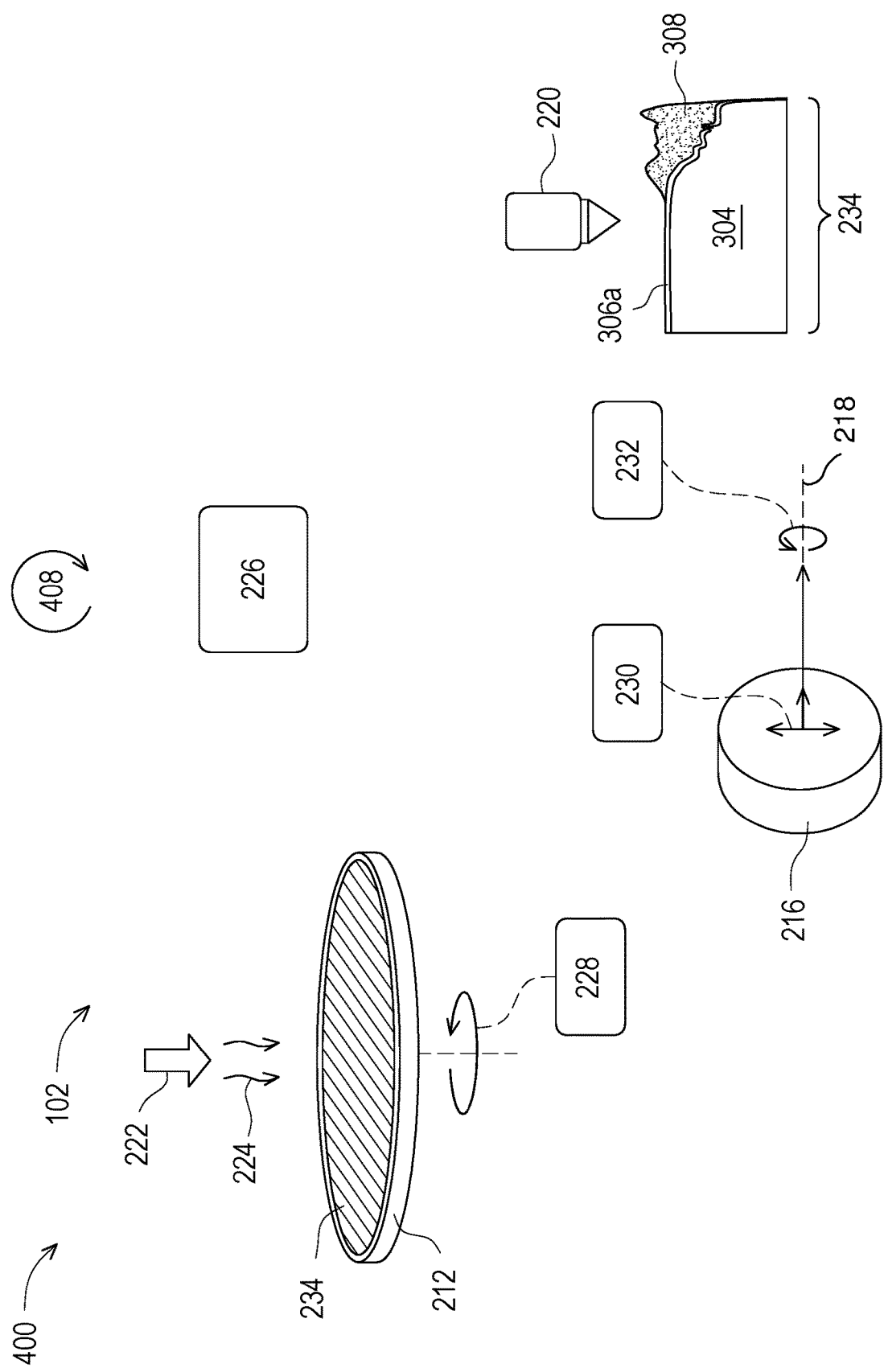

SEMICONDUCTOR PROCESSING TOOL AND METHODS OF OPERATION

BACKGROUND

A layer, a substrate, or a semiconductor substrate may be planarized using a polishing or planarizing technique such as chemical mechanical polishing/planarization (CMP). A CMP operation may include depositing a slurry (or polishing compound) onto a polishing pad. A semiconductor substrate may be mounted to and secured by a platen, which may rotate the semiconductor substrate as the semiconductor substrate is pressed against the polishing pad. The slurry and polishing pad act as an abrasive that polishes or planarizes one or more layers (e.g., metallization layers) of the semiconductor substrate as the semiconductor substrate is rotated. The polishing pad may also be rotated to ensure a continuous supply of slurry is applied to the polishing pad.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a diagram of an example semiconductor processing environment including a chemical mechanical polishing/planarization (CMP) tool described herein.

FIGS. 2A-2D are diagrams of example implementations the CMP tool of described herein.

FIGS. 3A-3D, 4A-4D, and 5 are diagrams of example implementations described herein.

DETAILED DESCRIPTION

Figure 2A:
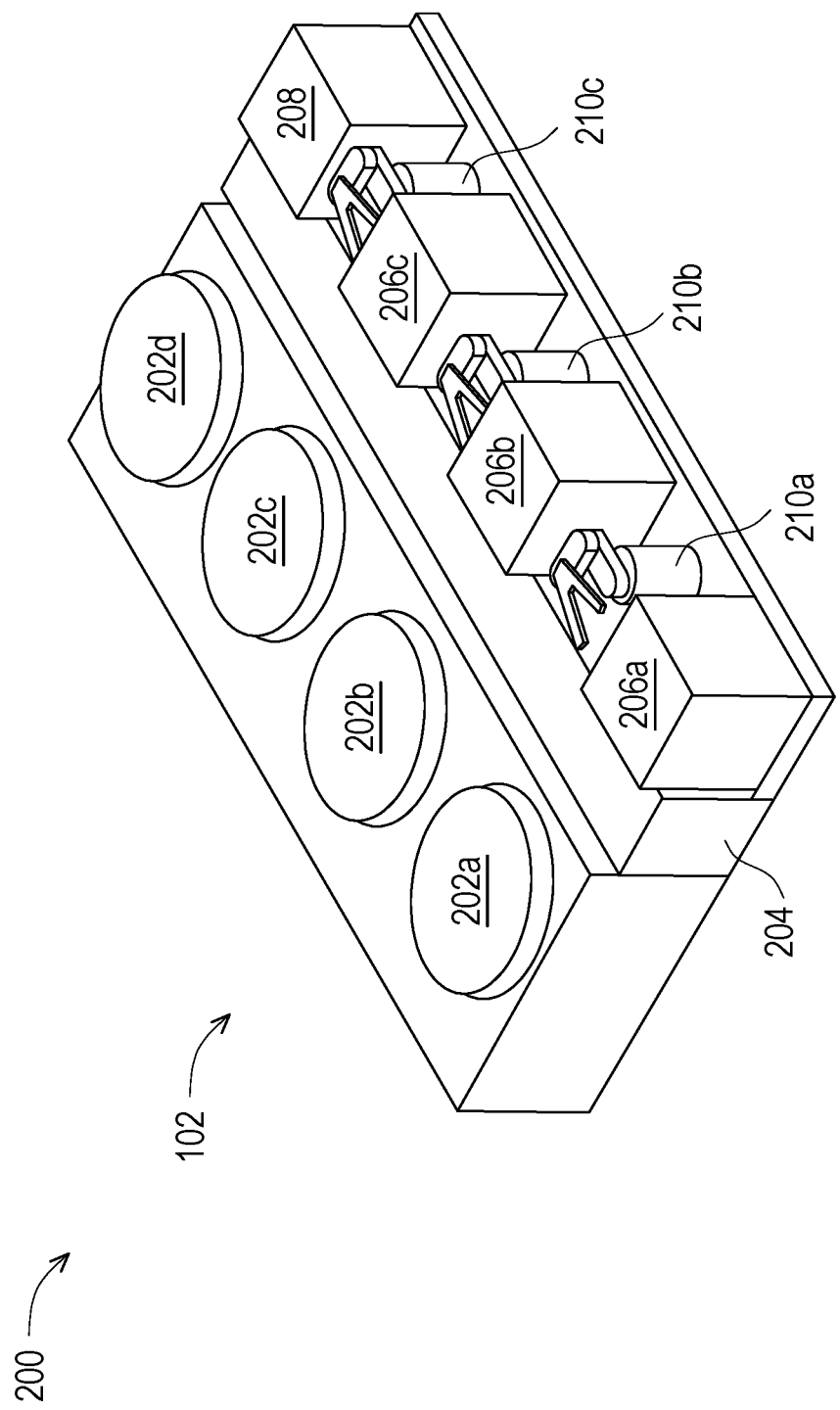

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor substrate may include a roll-off profile region at or/near a perimeter of the semiconductor substrate, which may prevent the semiconductor substrate from being bonded to another wafer in a multi-wafer stacking process (e.g., a wafer-on-wafer (WoW) process, among other examples). To form the roll-off profile to satisfy a threshold, techniques using CMP tool with a horizontally-oriented polishing pad may be used.

The techniques may include depositing an inordinate amount of a blanket oxide across an entire surface of the semiconductor substrate followed by depositing a bevel oxide around the perimeter of the semiconductor substrate. The techniques may include a lengthy polishing of the blanket oxide and the bevel oxide using the CMP tool with the horizontally-oriented polishing pad (e.g., a polishing pad that is coplanar with the semiconductor substrate). In some instances, a yield of semiconductor substrates (e.g., a yield of semiconductor substrates satisfying the roll-off profile) may be reduced. Additionally, such techniques may increase a need of resources related to fabricating the semiconductor substrate, including semiconductor processing tool resources and power resources.

Some implementations described herein provide techniques and apparatuses for polishing a perimeter region of a semiconductor substrate so that a roll-off profile at or near the perimeter region of the semiconductor substrate satisfies a threshold. The described implementations include depositing a first layer of a first oxide material across the semiconductor substrate followed by depositing a second layer of a second oxide material over the first layer of the first oxide material and around a perimeter region of the semiconductor substrate. The described implementations further include polishing the perimeter region using a CMP tool including one or more ring-shaped polishing pads oriented vertically over the perimeter region.

Techniques using the CMP tool including the one or more ring-shaped polishing pads allow for a focused and a controlled polishing of the second layer of the second oxide material over the perimeter region of the semiconductor substrate to tightly control the roll-off profile. Additionally, the techniques enable an amount of the first layer of the first oxide material deposited across the semiconductor substrate to be reduced relative to techniques using a CMP tool not including the ring-shape polishing pads. Additionally, the techniques may increase a throughput of a deposition tool depositing the first layer of the first oxide material and increase a throughput of the CMP tool.

In this way, a roll-off profile of the semiconductor substrate may be consistently formed to improve a yield of semiconductor substrates used for a multi-wafer stacking process. Additionally, an amount or resources needed to fabricate the semiconductor substrate, including semiconductor processing tool resources and power resources, may be reduced relative to techniques that polish the perimeter region of the semiconductor substrate using horizontally-oriented polishing pads.

FIG. 1 is a diagram of an example semiconductor processing environment 100 including a chemical mechanical polishing/planarization (CMP) tool described herein. The semiconductor processing environment 100 may include, or may be included in, a semiconductor fabrication facility, a semiconductor foundry, a semiconductor processing facility, a semiconductor clean room, and/or another environment in which semiconductor substrates and/or devices are processed. The semiconductor processing environment 100 may also include, or be included in, a factory floor of an original equipment manufacturer (OEM) of semiconductor tools.

The semiconductor processing environment 100 includes one or more semiconductor processing tools, including a CMP tool 102, a deposition tool 104, a bonding tool 106, and a wafer/die transport tool 108. The semiconductor processing tools 102-108 within the semiconductor processing environment 100 may perform one or more operations related to a multi-wafer stacking process (e.g., a wafer-on-wafer (WoW) process, among other examples).

The CMP tool 102 may polish or planarize a surface of a semiconductor substrate with a combination of chemical and mechanical forces (e.g., chemical etching and free abrasive polishing). The CMP tool 102 may utilize an abrasive and corrosive chemical slurry in conjunction with a polishing pad and retaining ring (e.g., typically of a greater diameter than the semiconductor device and not limited thereto). The polishing pad and the semiconductor substrate may be pressed together by a dynamic polishing head and held in place by the retaining ring. The dynamic polishing head may rotate with different axes of rotation to remove material and even out any irregular topography of the semiconductor substrate, making the semiconductor substrate flat or planar.

The deposition tool 104 is a semiconductor processing tool that is capable of depositing various types of materials onto a semiconductor substrate. In some implementations, the deposition tool 104 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 104 includes a physical vapor deposition (PVD) tool, such as a sputtering tool or another type of PVD tool. The deposition tool 104 may be configured to blanketly deposit a material across an entire surface of the semiconductor substrate. Additionally, or alternatively, the deposition tool 104 may be configured to selectively deposit a material on a perimeter region of the semiconductor substrate using a bevel deposition (BvD) process. In some implementations, the semiconductor processing environment 100 includes a plurality of types of the deposition tool 104.

The bonding tool 106 is a semiconductor processing tool that is capable of bonding two or more semiconductor substrates (e.g., two or more semiconductor wafers, among other examples) together. For example, the bonding tool 106 may include a eutectic bonding tool that is capable of forming a eutectic bond between two or more semiconductor substrates. In these examples, the bonding tool 106 may heat the two or more semiconductor substrates to form a eutectic system between the materials of the two or more semiconductor substrates. In some implementations, the bonding tool 106 is used to bond two or more semiconductor substrates as part of a multi-wafer stacking process (e.g., a wafer-on-wafer (WoW) process, among other examples).

Wafer/die transport tool 108 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-106, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 108 may be a programmed device that is configured to travel a particular path and/or may operate semi-autonomously or autonomously. In some implementations, the environment 100 includes a plurality of wafer/die transport tools 108.

As described in greater detail in connection with FIGS. 2A-8, and elsewhere herein, the semiconductor processing tools 102-106 may perform a series of operations related to processing a semiconductor substrate. For example, and in some implementations, the series of operations includes forming a first layer of a first material over a semiconductor substrate and forming a second layer of a second material on a portion of the first layer of the first material over a perimeter region of the semiconductor substrate. The series of operations includes rotating the semiconductor substrate about a vertical axis passing through a center of the semiconductor substrate. The method further includes removing a portion of the second layer of the second material using a combination of one or more ring-shaped polishing pads rotating about one or more axes that are approximately orthogonal to the vertical axis.

As indicated above, FIG. 1 is provided as an example. Other examples may differ from what is described with regard to FIG. 1.

FIGS. 2A-2D are diagrams of example implementations 200 of the CMP tool 102 described herein. As shown in FIG. 2A, the CMP tool 102 includes one or more processing chambers 202a-202d in which layers and/or structures of a semiconductor substrate are polished or planarized. In some implementations, a processing chamber 202 is configured to polish or planarize a surface (or a layer or structure) of a semiconductor substrate with a combination of chemical and mechanical forces (e.g., chemical etching and free abrasive polishing). The CMP tool 102 is configured to utilize an abrasive and corrosive chemical slurry in conjunction with a polishing pad and retaining ring (e.g., typically of a greater diameter than the semiconductor substrate) in a processing chamber 202. To perform a CMP operation, the CMP tool 102 presses the polishing pad against the semiconductor substrate in the processing chamber 202 using a dynamic polishing head that is held in place by the retaining ring. The dynamic polishing head may rotate with different axes of rotation to remove material and even out any irregular topography of a layer or a structure of the semiconductor substrate, thereby making the layer or a structure of the semiconductor substrate flat or planar.

The CMP tool 102 includes a processing chamber 204 in which semiconductor substrates are transferred to and from the processing chamber(s) 204. Moreover, semiconductor substrates are transferred between the processing chamber 204 and one or more cleaning chambers 206a-206c included in the CMP tool 102. A cleaning chamber 206 (also referred to as a CMP cleaning chamber or a post-CMP cleaning chamber) is a component of the CMP tool 102 that is configured to perform a post-CMP cleaning operation to clean or remove residual slurry and/or removed material from a semiconductor substrate that has undergone a CMP operation. In some implementations, the CMP tool 102 includes a plurality of cleaning chambers 206, and the CMP tool 102 is configured to process a semiconductor substrate through a plurality of sequential post-CMP cleaning operations in the plurality of cleaning chambers 206. As an example, the CMP tool 102 may process a semiconductor substrate in a first post-CMP cleaning operation in a cleaning chamber 206a, may process the semiconductor substrate in a second post-CMP cleaning operation in a cleaning chamber 206b, may process the semiconductor substrate in a third post-CMP cleaning operation in a cleaning chamber 206c, and so on.

A cleaning chamber 206 cleans a semiconductor substrate using a cleaning agent such as isopropyl alcohol (IPA), a chemical solution that includes a plurality of cleaning chemicals, and/or another type of cleaning agent. The CMP tool 102 includes one or more types of cleaning chambers 206. Each type of cleaning chamber 206 is configured to clean a semiconductor substrate using a different type of cleaning device. In some implementations, a cleaning chamber 206 includes a brush-type cleaning chamber. A brush-type cleaning chamber is a cleaning chamber that includes one or more cleaning brushes (or roller brushes) that are configured to spin or rotate to brush-clean a semiconductor substrate. In some implementations, a cleaning chamber 206 includes a pen-type cleaning chamber. A pen-type cleaning chamber is a cleaning chamber that includes a cleaning pen (or cleaning pencil) that is configured to provide fine-tuned and detailed cleaning of a semiconductor substrate.

In some implementations, the cleaning chambers 206a-206c of the CMP tool 102 are arranged such that a semiconductor substrate is first processed in one or more brush-type cleaning chambers (e.g., to remove a large amount of removed material and residual slurry from the semiconductor substrate), and is then processed in a pen-type cleaning chamber (e.g., to provide detailed cleaning of structures and/or recesses in the semiconductor substrate). As an example, the cleaning chambers 206a and 206b may be configured as brush-type cleaning chambers, and cleaning chamber 206c may be configured as a pen-type cleaning chamber.

The CMP tool 102 includes a rinsing chamber 208 that is configured to rinse a semiconductor substrate after one or more post-CMP cleaning operations. The rinsing chamber 208 rinses a semiconductor substrate to remove residual cleaning agent from the semiconductor substrate. The rinsing chamber 208 is configured to use a rinsing agent, such as deionized water (DIW) or another type of rinsing agent, to rinse a semiconductor substrate. Semiconductor substrates are transferred to the rinsing chamber 208 from a cleaning chamber 206 directly or through the processing chamber 204. In some implementations, a semiconductor substrate is processed in a drying operation in the rinsing chamber 208, in which the semiconductor substrate is dried to prevent oxidation and/or other types of contamination of the semiconductor substrate.

The CMP tool 102 includes a plurality of transport devices 210a-210c. The transport devices 210a-210c include robot arms or other types of transport devices that are configured to transfer semiconductor substrates between the processing chamber(s) 202, the processing chamber 204, the cleaning chamber(s) 206, and/or the rinsing chamber 208.

As described in greater detail in connection with FIGS. 2B-8, and elsewhere herein, the CMP tool 102 may include additional features. For example, and in some implementations, the CMP tool 102 includes a platen configured to rotate a semiconductor substrate about a vertical axis at a first rotational velocity. The CMP tool 102 includes a ring-shaped polishing pad configured to rotate about a horizontal axis that is approximately orthogonal to the vertical axis at a second rotational velocity. The CMP tool 102 includes a polishing pad motor component mechanically-coupled to the ring-shaped polishing pad, and a camera component. The CMP tool 102 includes a controller configured to, receive, from the camera component, a first signal including first information corresponding to a status of a polishing operation performed at or near a perimeter region of the semiconductor substrate and determine, based on the first information, to adjust the second rotational velocity of the ring-shaped polishing pad. The controller is configured to transmit, to the polishing pad motor component, a second signal including second information to cause the polishing pad motor component to adjust the second rotational velocity.

Additionally, or alternatively, a controller of the CMP tool 102 may perform a series of operations. For example, and in some implementations, the series of operations includes transmitting, by a controller, a first signal including first information to cause a platen motor component to rotate a platen holding a semiconductor substrate about a first axis at a first rotational velocity. The series of operations includes transmitting, by the controller, a second signal including second information to cause a polishing pad motor component to rotate a ring-shaped polishing pad about a second axis that is approximately orthogonal to the first axis at a second rotational velocity. The series of operations includes receiving, by the controller and from a camera component, a third signal including third information corresponding to a status of a polishing operation performed at or near a perimeter region of the semiconductor substrate. The series of operations includes determining, by the controller and based on the third information, to adjust the second rotational velocity. The series of operations includes transmitting, by the controller, a fourth signal including fourth information to cause the polishing pad motor component to adjust the second rotational velocity.

Figure 2B:
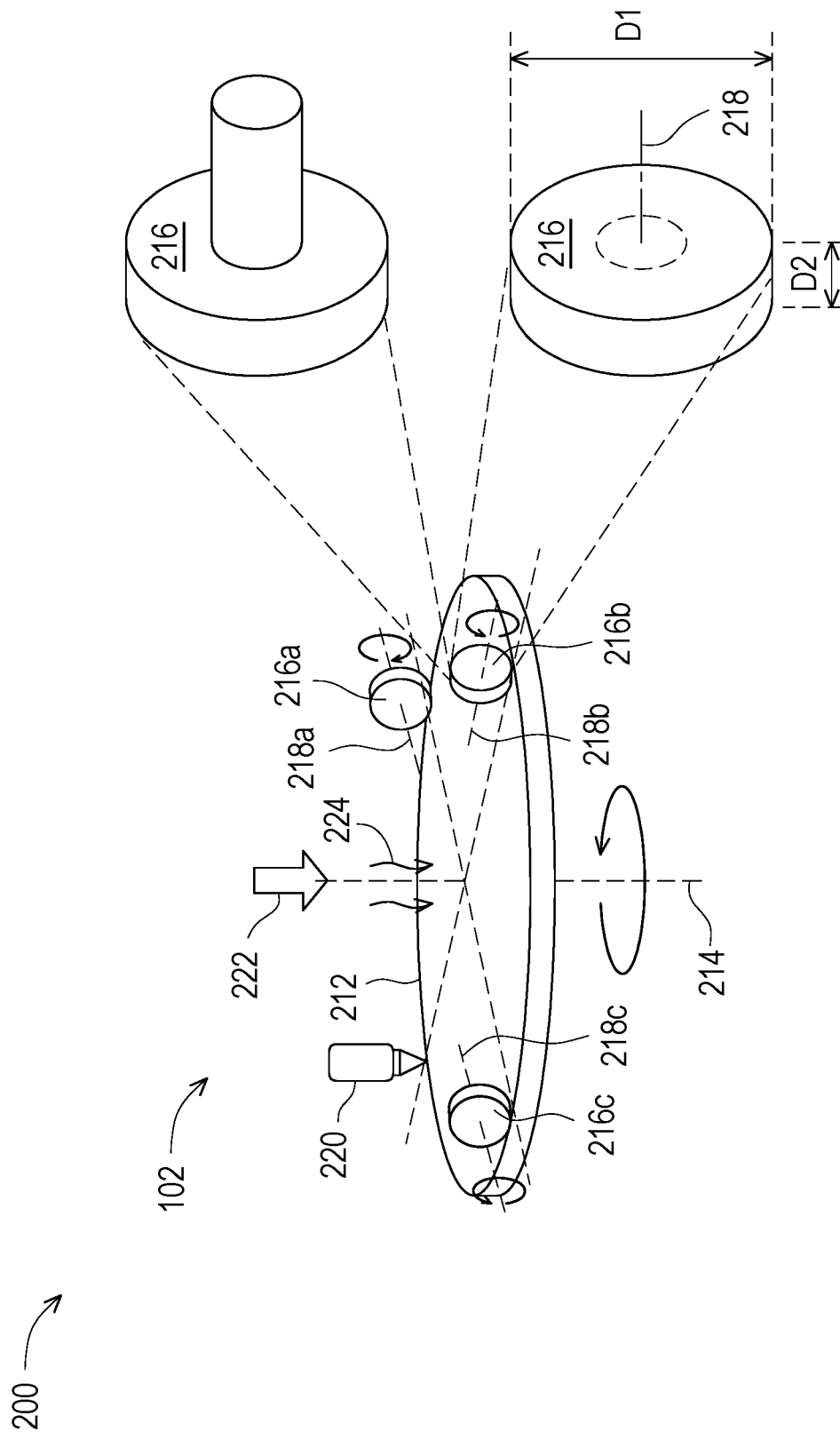

FIG. 2B shows additional details of the CMP tool 102, including a platen 212 configured to rotate about a vertical axis 214. The platen 212 may include, for example, a stainless steel material. The platen 212 may be approximately circular and hold (e.g., capture or secure) a semiconductor substrate using a vacuum chucking mechanism or an electrostatic chucking mechanism, among other examples. In some implementations, the vertical axis 214 corresponds to a central axis that passes through a center of the platen 212.

The CMP tool 102 may include at least one ring-shaped polishing pad 216 (e.g., a polishing disk) configured to rotate about a horizontal axis 218 that is approximately orthogonal to the vertical axis 214. For example, and as shown in FIG. 2B, the CMP tool 102 includes the ring-shaped polishing pads 216a-216c that are configured to rotate about the horizontal axes 218a-218c, where each of the horizontal axes 218a-218c is approximately orthogonal to the vertical axis 214.

In some implementations, the ring-shaped polishing pad 216 includes a core (e.g., a dis-shaped structure) that includes a stainless steel material. In some implementations, a perimeter of the core is coated with a polymeric material for polishing a surface (e.g., a perimeter region of a semiconductor substrate, among other examples). In some implementations, the ring-shaped polishing pad 216 may be ring-shaped with a central hole for a rotating rod or may be a circle-shaped pad held by a rotating rod.

The ring-shaped polishing pad 216 may include one or more dimensional properties. For example, the ring-shaped polishing pad 216 may include diameter D1 that is included in a range of approximately 45 millimeters (mm) to approximately 55 mm. Additionally, or alternatively, the ring-shaped polishing pad 216 may include a thickness D2 that is included in a range of approximately 1 millimeter to approximately 2 millimeters. However, other values and ranges for the diameter D1 and the diameter D2 are within the scope of the present disclosure.

As shown in FIG. 2B, the CMP tool 102 includes a camera component 220. The camera component 220 may capture one or more images related to a polishing operation performed by the CMP tool 102. The camera component 220 may include a complementary metal-oxide semiconductor (CMOS) image sensor or a charge coupled device (CCD) image sensor, among other examples. In some implementations, the camera component 220 is located above a perimeter region of the platen 212.

As shown in FIG. 2B, the CMP tool 102 includes a slurry dispense component 222. The slurry dispense component 222 may include a pump and/or a nozzle that dispense a slurry material 224. The slurry material 224 may include an abrasive compound and a fluid such as deionized water, or a liquid cleaner such as potassium hydroxide (KOH) over the platen 212 (e.g., onto a semiconductor substrate held by the platen 212). In an example, a flow rate of the slurry material 224 may be in a range of approximately 50 milliliters (ml)/minute to approximately 350 ml/minute. However, other values and ranges for the flow rate of the slurry material 224 are within the scope of the present disclosure.

FIG. 2C shows details relating to additional components of the CMP tool 102. As shown in FIG. 2C the CMP tool 102 includes a controller 226. The controller 226 may include a processor or a combination of a processor and memory, among other examples.

The CMP tool 102 further includes a platen motor component 228 that is mechanically-coupled to the platen 212, an actuator component 230 that is mechanically-coupled to the ring-shaped polishing pad 216 (or multiples of the actuator component 230 to accommodate multiples of the ring-shaped polishing pad 216), and/or a polishing pad motor component 232 that is mechanically-coupled to the ring-shaped polishing pad 216 (or multiples of the polishing pad motor component 232 to accommodate multiples of the ring-shaped polishing pad 216).

The platen motor component 228 may include a stepper motor or a servo motor, among other examples. The platen motor component 228 may cause the platen 212 to rotate about the vertical axis 214 at a rotational velocity. In an implementation in which the platen 212 holds a semiconductor substrate 234, the semiconductor substrate 234 may also rotate about the vertical axis 214 at the rotational velocity.

The actuator component 230 may include a linear motor or a pneumatic cylinder, among other examples. The actuator component 230 may include one or more subcomponents that provide a force (e.g., a compressive force) to engage the ring-shaped polishing pad 216 with the semiconductor substrate 234 during a polishing operation. Additionally, or alternatively, the actuator component 230 may include one or more subcomponents to change a lateral or horizontal position of the ring-shaped polishing pad 216 along the horizontal axis 218. In some implementations, the actuator component 230 includes a force sensor (e.g., a piezoelectric force sensor, among other examples). In some implementations, the actuator component 230 includes a position sensor (e.g., a laser position sensor, among other examples).

The polishing pad motor component 232 may include a stepper motor or a servo motor, among other examples. The polishing pad motor component 232 may cause the ring-shaped polishing pad 216 to rotate about the horizontal axis 218 at a rotational velocity.

In an implementation including multiple instances of the ring-shaped polishing pad 216 (e.g., an implementation including additional ring-shaped polishing pads configured to rotate about additional horizontal axes, such as the ring-shaped polishing pads 216a-216c configured to rotate about the horizontal axes 218a-218c), rotational profiles (e.g., rotational velocities, rotational accelerations, or rotational directions, among other examples) may vary. For example, a rotational velocity of the ring-shaped polishing pad 216a (e.g., an outer rings-shaped polishing pad), may be greater relative to a rotational velocity of the ring-shaped polishing pad 216b (e.g., a middle ring-shaped polishing pad). Additionally, or alternatively, the rotational velocity of the ring-shaped polishing pad 216b may be greater relative to a rotational velocity of the ring-shaped polishing pad 216c (e.g., an inner ring-shaped polishing pad).

In some implementations, and as shown in FIG. 2C, the controller 226 is communicatively coupled to one or more components of the CMP tool 102 using one or more communication links 236a-236e (e.g., one or more wireless-communication links, one or more wired-communication links, or a combination of one or more wireless-communication links and one or more wired-communication links).

As described in greater detail in connection with FIGS. 4A-4D, and elsewhere herein, the controller 226 may receive information (e.g., image data from the camera component 220, position data from the actuator component 230, and/or force data from the actuator component 230, among other examples) related to an edge-polishing operation being performed by the CMP tool 102 (e.g., a polishing operation removing material from a perimeter region of the semiconductor substrate 234). Using such information, the controller 226 may adjust one or more performance parameters related to the edge-polishing operation, including a dispense rate of the slurry dispense component 222, a mixture of the slurry material 224, a rotational profile of the platen motor component 228 (e.g., a rotational velocity, a rotational acceleration, or rotational direction), a compressive force between the ring-shape polishing pad 216 and the semiconductor substrate 234 (e.g., a compressive force measured or detected by the actuator component 230), a location of the ring-shaped polishing pad 216 along the horizontal axis 218 (e.g., a location measured or detect by the actuator component 230), a rotational profile of the polishing pad motor component 232 (e.g., a rotational velocity, a rotational acceleration, or a rotational direction).

Figure 2D:
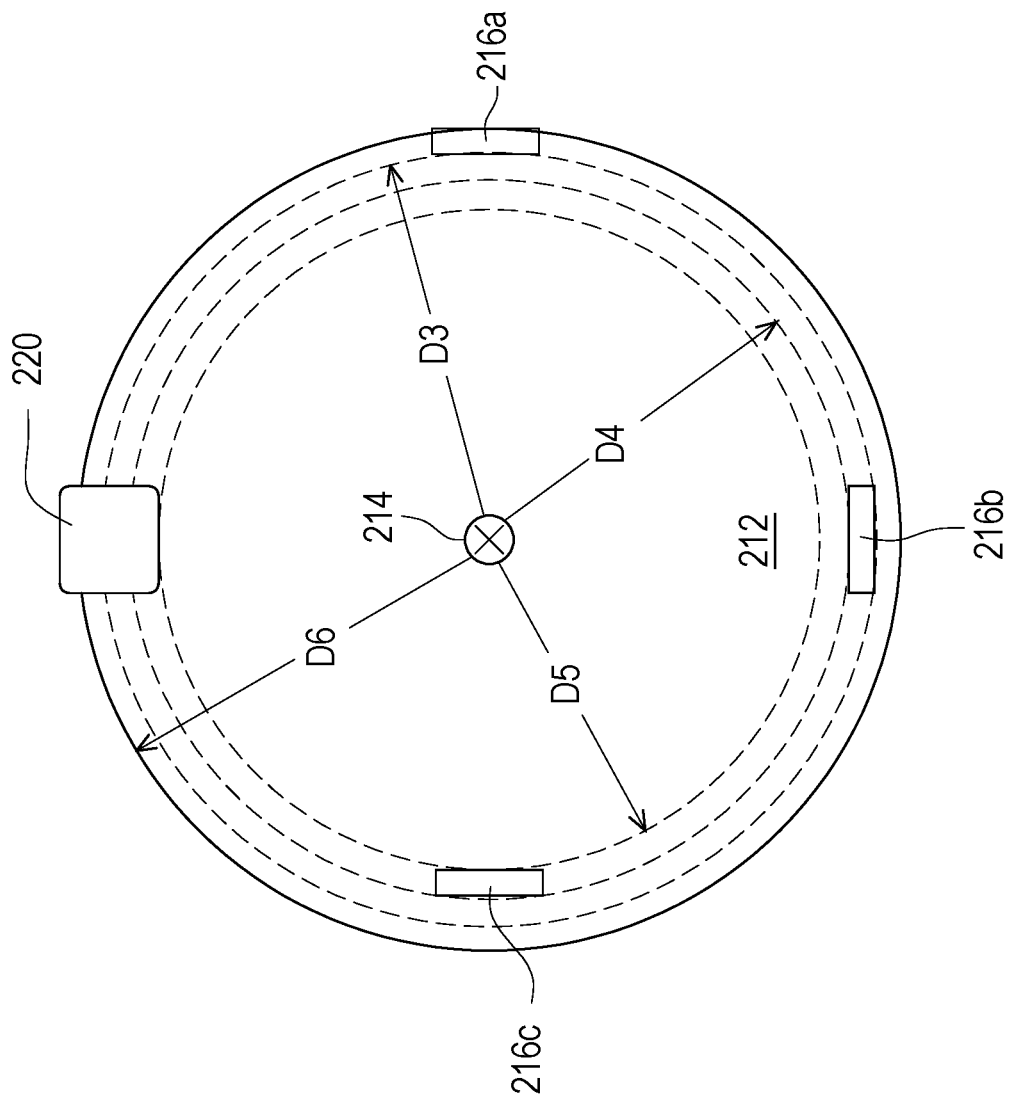

FIG. 2D shows a top view of the platen 212 including locations of the ring-shaped polishing pads 216a-216c and the camera component 220 above the platen 212 (e.g., above the semiconductor substrate 234 during an edge-polishing operation by the CMP tool 102). The locations of the ring-shaped polishing pads 216a-216c may correspond to radial distances from the vertical axis 214 to respective inner-edges of the ring-shaped polishing pads 216a-216c.

In some implementations, the polishing pads 216a-216c are staggered from one another. For example, and as shown in FIG. 2D, a radial distance D3 corresponding to an inner-edge of the ring-shaped polishing pad 216a is greater relative to a radial distance D4 corresponding to an inner-edge of the ring-shaped polishing pad 216b. Additionally, or alternatively, the radial distance D4 is greater relative to a radial distance D5 corresponding to an inner-edge of the ring-shaped polishing pad 216c. In some implementations, an actuator component (e.g., the actuator component 230) may adjust one of the radial distances D3-D5. In some implementations, a radial distance D6 to an outer edge (e.g., a perimeter edge of the platen) may be approximately equal to, or greater relative to, a radius of a semiconductor substrate (e.g., 100 millimeters for a 200 millimeter diameter wafer, 150 millimeters for a 300 millimeter diameter wafer, or 200 millimeters for a 400 millimeter diameter wafer, among other examples)

The number and arrangement of devices shown in FIGS. 2A-2D are provided as one or more examples. In practice, there may be additional devices, fewer devices, different devices, or differently arranged devices than those shown in FIGS. 2A-2D. Furthermore, two or more devices shown in FIGS. 2A-2D may be implemented within a single device, or a single device shown in FIGS. 2A-2D may be implemented as multiple, distributed devices. Additionally, or alternatively, a set of devices (e.g., one or more devices) shown in FIGS. 2A-2D may perform one or more functions described as being performed by another set of devices shown in FIGS. 2A-2D.

FIGS. 3A-3D are diagrams of example implementation 300 described herein. The implementation 300 may correspond to a series of operations performed by one or more of the semiconductor processing tools described in connection with FIG. 1, including the CMP tool 102 and the deposition tool 104. FIGS. 3A-3D include side views of the semiconductor substrate 234, which may include an epitaxial layer 304. The epitaxial layer 304 may correspond to a substrate material, including silicon (Si), among other examples.

Figure 3A:
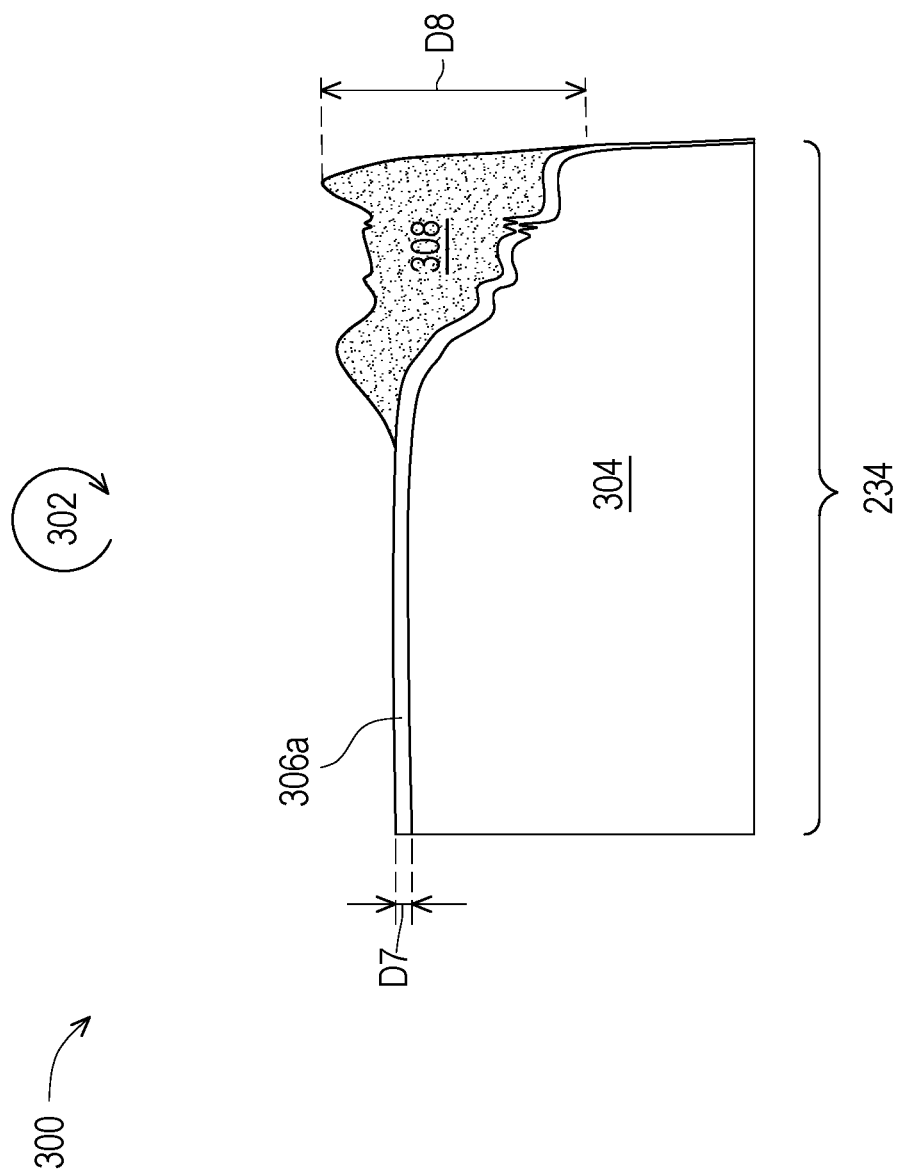

As shown in FIG. 3A, operation 302 includes forming multiple layers of materials over the semiconductor substrate 234, including a layer of a material 306a and a layer of material 308. In some implementations, the layer of the material 306a corresponds to a blanketly-deposited oxide material excluding nitrogen. In some implementations, the layer of the material 308 corresponds to a selectively-deposited oxide material including nitrogen.

To form the layer of the material 306a, a deposition tool (e.g., the deposition tool 104 of FIG. 1) may deposit a silicon oxide (SiO2) material using a CVD process, among other examples. In some implementations, and as shown in FIG. 3A, a thickness D7 of layer of the material 306a may be included in a range of approximately 900 angstroms to approximately 1100 angstroms. If the thickness D7 is less than approximately 900 angstroms, a thickness of subsequently formed materials over the semiconductor substrate 234 may not be thick enough to prevent damage to integrated circuitry included on the semiconductor substrate 234 during a subsequent polishing operation (e.g., planarization by the CMP tool 102 using a horizontally-oriented polishing pad rotating about the vertical axis 214, among other examples). If the thickness D7 is greater than approximately 1100 angstroms, resources needed to fabricate the semiconductor substrate 234 may increase. However, other values and ranges for the thickness D7 are within the scope of the present disclosure.

To form the layer of the material 308, a deposition tool (e.g., the deposition tool 104 of FIG. 1) may selectively deposit a silicon oxynitride (SiON) material using a bevel deposition (BvD) process, among other examples. The layer of the material 308 may be formed on a portion of the layer of material 306a over a perimeter region of the semiconductor substrate 234.

In some implementations, and as shown in FIG. 3A, a thickness D8 of the layer of the material 308 is included in a range of approximately 17,100 angstroms to approximately 20,900 angstroms. If the thickness D8 is less than approximately 17,100 angstroms, an amount of the layer of the material 308 may be insufficient to compensate for an incoming roll-off profile of the semiconductor substrate 234. If the thickness D8 is greater than approximately 20,900 angstroms, resources needed to manufacture the semiconductor substrate 234 may increase. However, other values and ranges for the thickness D8 are within the scope of the present disclosure.

Figure 3B:
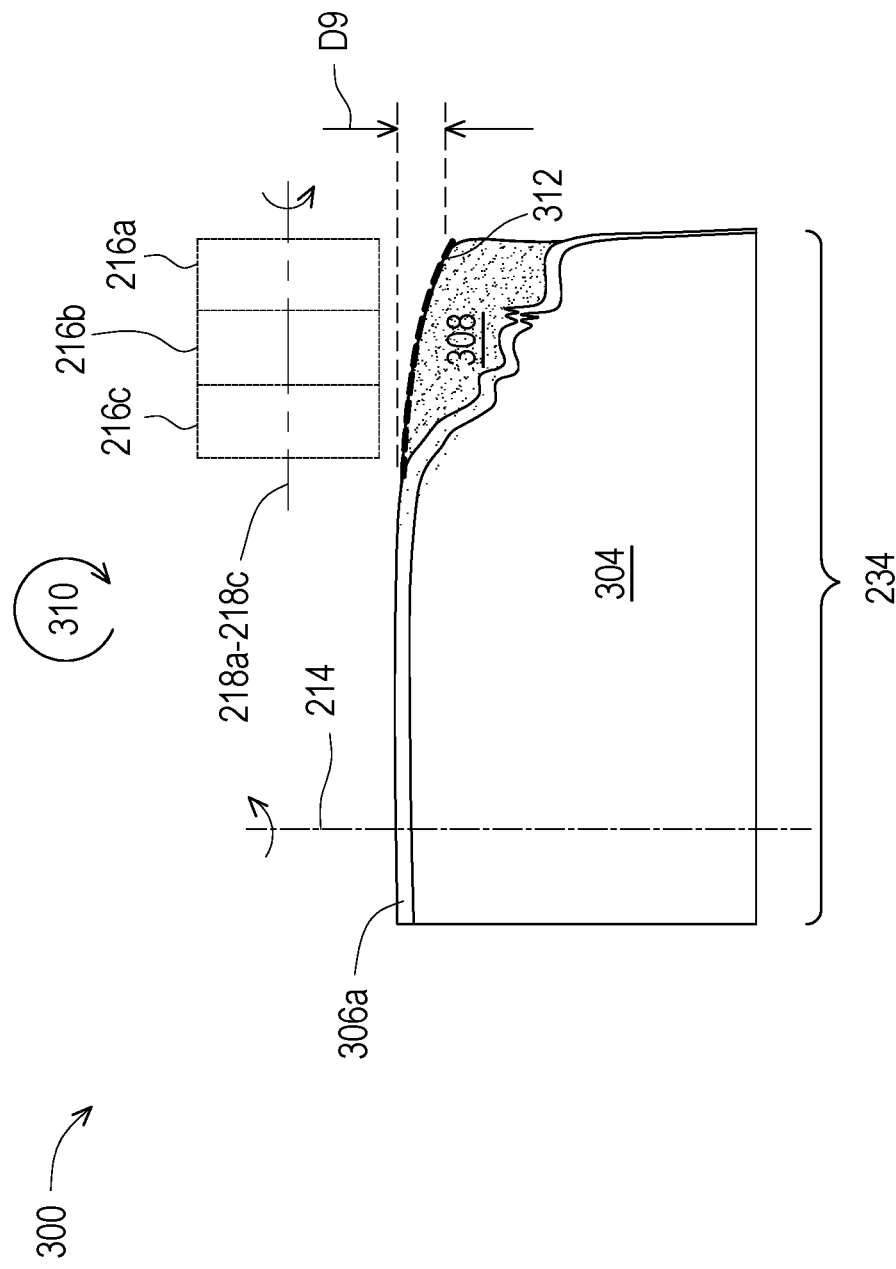

As shown in FIG. 3B, an edge-polishing operation 310 removes a portion of the layer of the material 308 to form a roll-off profile 312 at the perimeter region of the semiconductor substrate 234. In some implementations, and as shown in FIG. 3B, removing the portion of the layer of the material 308 excludes removing a portion of the layer of the material 306a.

Removing the portion of the layer of the material 308 may include a CMP tool (e.g., the CMP tool 102) rotating the semiconductor substrate 234 about the vertical axis 214 passing through the center of the semiconductor substrate 234. Additionally, or alternatively, forming the roll-off profile 312 may further include the CMP tool rotating the ring-shaped polishing pads 216a-216c about the horizontal axes 218a-218c that are approximately orthogonal to the vertical axis 214.

In some implementations, the CMP tool will polish the edge region of the semiconductor substrate 234 so that the roll-off profile 312 satisfies a threshold. As an example, the threshold may include the roll-off profile 312 including a curvature. The curvature may include a roll-off depth D9 having a range of less than approximately 5000 angstroms at or near a perimeter region of the semiconductor substrate 234. Such a threshold, including the roll-off depth D9, may improve a yield of a subsequent multi-wafer stacking process. However, other values and ranges for the roll-off depth D9 are within the scope of the present disclosure.

In some implementations, removing the portion of the layer of the material 308 includes removing an amount that is included in a range of approximately 13,500 angstroms to approximately 16,500 angstroms. If the amount is less than approximately 13,500 angstroms, the depth D9 may not satisfy a lower threshold. If the amount is greater than approximately 16,500 angstroms, the depth D9 may not satisfy an upper threshold and damage to the semiconductor substrate 234 may occur. However, other values and ranges for the amount of the layer of the material 308 removed by the CMP tool performing the edge-polishing operation 310 are within the scope of the present disclosure.

Figure 3C:
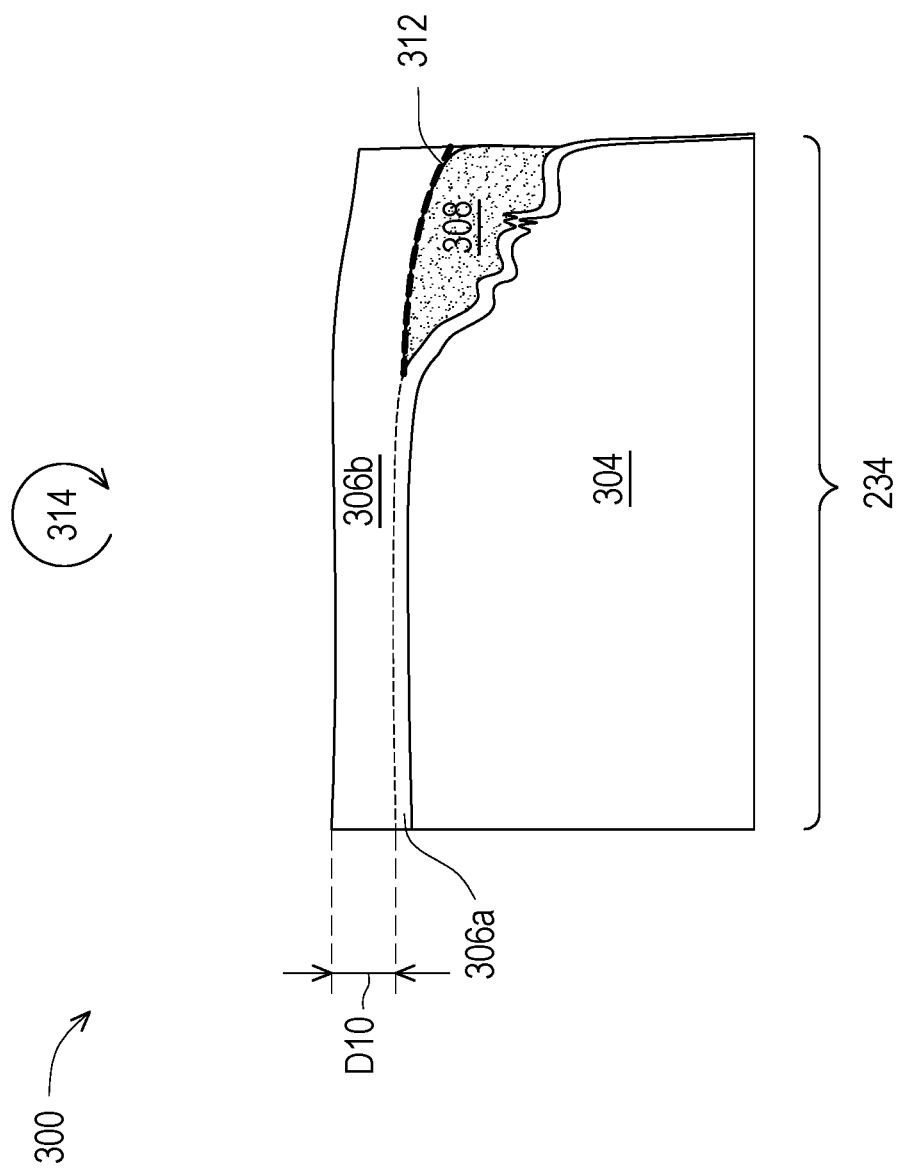

As shown in FIG. 3C, operation 314 includes forming a layer of a material 306b on the layer of material 306a and on the roll-off profile 312 (e.g., a surface of a remaining portion of the layer of material 308). To form the layer of the material 306b, a deposition tool (e.g., the deposition tool 104 of FIG. 1) may deposit a silicon oxide (SiO2) material using a CVD process, among other examples. In some implementations, and as shown in FIG. 3C, a thickness D10 of layer of the material 306b may be included in a range of approximately 17,200 angstroms to approximately 19,800 angstroms. However, other values and ranges for the thickness D10 are within the scope of the present disclosure.

Figure 3D:
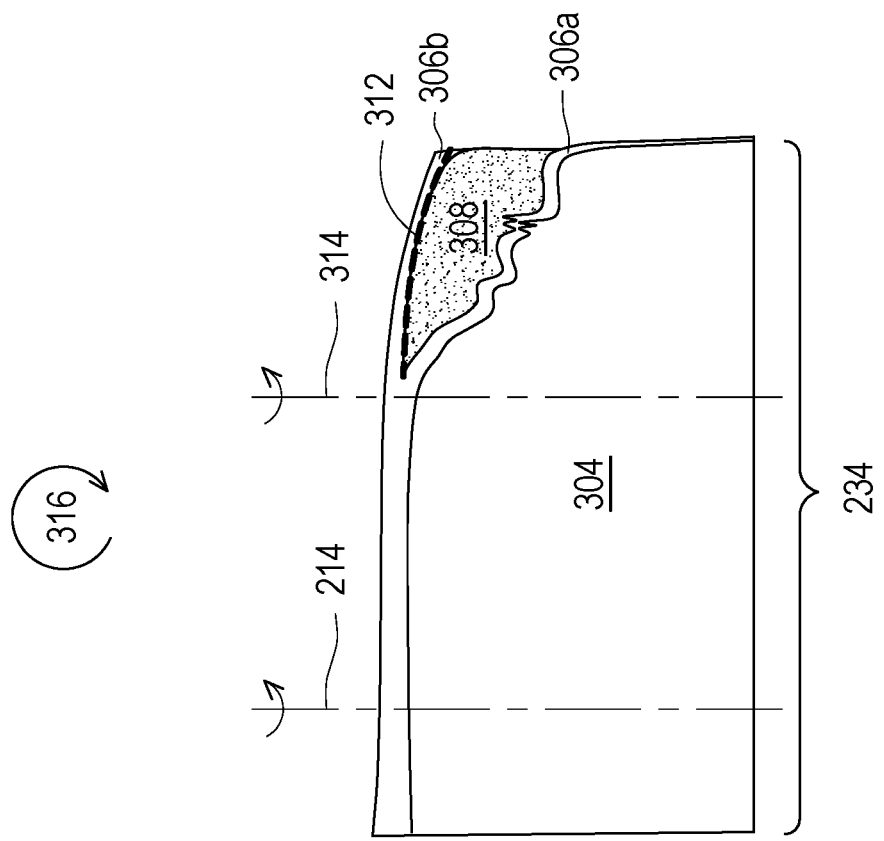

As shown in FIG. 3D, a planar CMP operation 316 removes a portion of the layer of the material 306b. Removing the portion of the layer of the material 306b may include a CMP tool (e.g., the CMP tool 102) rotating the semiconductor substrate 234 about the vertical axis 214 passing through the center of the semiconductor substrate 234. Additionally, or alternatively, removing the portion of the layer of the material 306b may further include the CMP tool rotating a horizontally-oriented polishing pad about a vertical axis 214 that is approximately parallel to the vertical axis 214. In some implementations, removing the portion of the layer of the material 306b includes removing an amount that is included in a range of approximately 13,500 angstroms to approximately 16,500 angstroms. However, other values and ranges for the amount of the layer of the material 306b removed are within the scope of the present disclosure.

In some implementations, one or more of the layer of material 306a or the layer of material 306b have a property corresponding to a polishing rate (e.g., a removal rate in angstroms per minute based on one or more of a composition of the slurry material 224, a rotational velocity of the platen 212 holding the semiconductor substrate 234, and/or a rotational velocity of the ring-shaped polishing pad 216, among other examples). Additionally, or alternatively, the layer of material 308 may have a property corresponding to another polishing rate that is different relative to the polishing rate of the layer of material 306a and/or the layer of material 306b. For example, and in some implementations, the polishing rate of the layer of material 308 may be lesser relative to the polishing rate of the layer of material 306a and/or the layer of material 306b.

FIGS. 3A-3D describes a technique including a series of operations to fabricate a semiconductor substrate 234 including the roll-off profile 312. An aggregate thickness of the layers of the materials 306a and 306b (e.g., D7 plus D10), as described in connection with FIGS. 3A-3D, may be up to approximately 50% less than a combined thickness of the layers of the materials 306a and 306b using other techniques to fabricate the semiconductor substrate 234 including the roll-off profile 312. Such a reduction may result in material cost savings and increased throughput of semiconductor manufacturing tools (e.g., the CMP tool 102 and the deposition tool 104, among other examples).

Figure 4A:
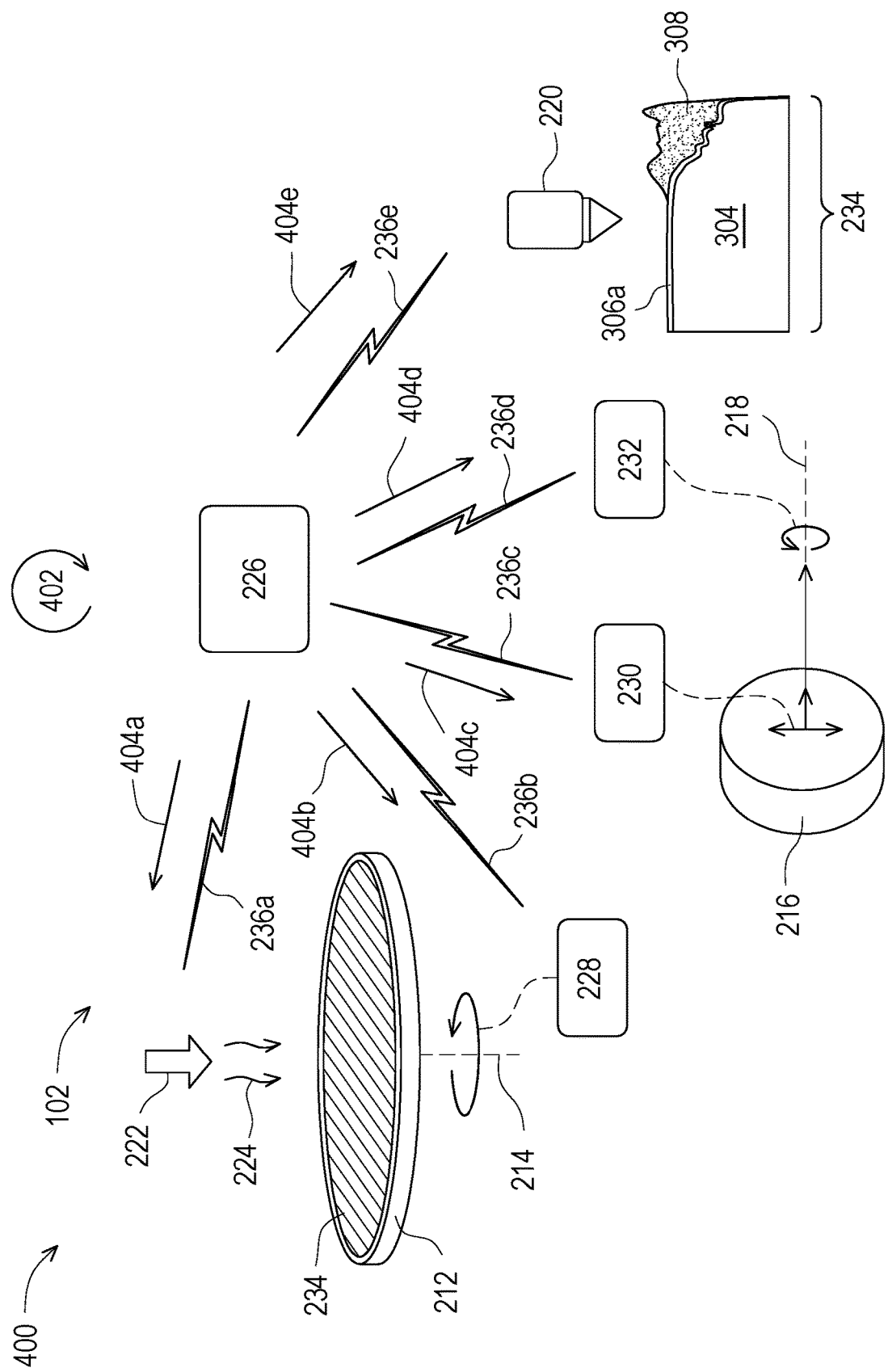

FIGS. 4A-4D are diagrams of an example implementation 400 described herein. As shown in FIG. 4A, the semiconductor substrate 234 is held by the platen 212. As part of operation 402, the controller 226 may transmit one or more signals including information to initiate an edge-polishing operation. For example, the controller 226 may transmit a signal to the slurry dispense component 222 using the communication link 236a. The signal to the slurry dispense component 222 may include information 404a corresponding to a setting that initiates or controls a flow rate of the slurry material 224 from the slurry dispense component 222 or a setting that controls a mixture of the slurry material 224 flowing from the slurry dispense component 222, among other examples.

Additionally, or alternatively, the controller 226 may transmit a signal to the platen motor component 228 using the communication link 236b. The signal to the platen motor component 228 may include information 404b corresponding to a setting that initiates a rotational motion or controls a rotational profile (e.g., a rotational velocity, a rotational direction, or rotational acceleration, among other examples) of the platen motor component 228 (e.g., the platen 212 and/or the semiconductor substrate 234) about the vertical axis 214, among other examples.

Additionally, or alternatively, the controller 226 may transmit a signal to the actuator component 230 using the communication link 236c. The signal to the actuator component 230 may include information 404c corresponding to a setting that controls a location of the ring-shaped polishing pad 216 along the horizontal axis 218, a setting that initiates an engagement or a disengagement of the ring-shaped polishing pad 216 and the semiconductor substrate 234, or a setting that controls a force with which the ring-shaped polishing pad 216 contacts the semiconductor substrate 234, among other examples.

Additionally, or alternatively, the controller 226 may transmit a signal to the polishing pad motor component 232 using the communication link 236d. The signal to the polishing pad motor component 232 may include information 404d corresponding to a setting that controls a rotational profile (e.g., a rotational velocity, a rotational direction, or rotational acceleration, among other examples) of the ring-shaped polishing pad 216 about the horizontal axis 218, among other examples.

Additionally, or alternatively, the controller 226 may transmit a signal to the camera component 220 using the communication link 236e. The signal to the camera component 220 may include information 404e corresponding to a setting that controls an activation of the camera component 220, a setting that controls focal point of the camera component 220 (e.g., a focal point to capture a perimeter region of the semiconductor substrate 234, the layer of material 306a, or the layer of material 308, among other examples), or a setting that controls a resolution of the camera component 220, among other examples.

Figure 4B:
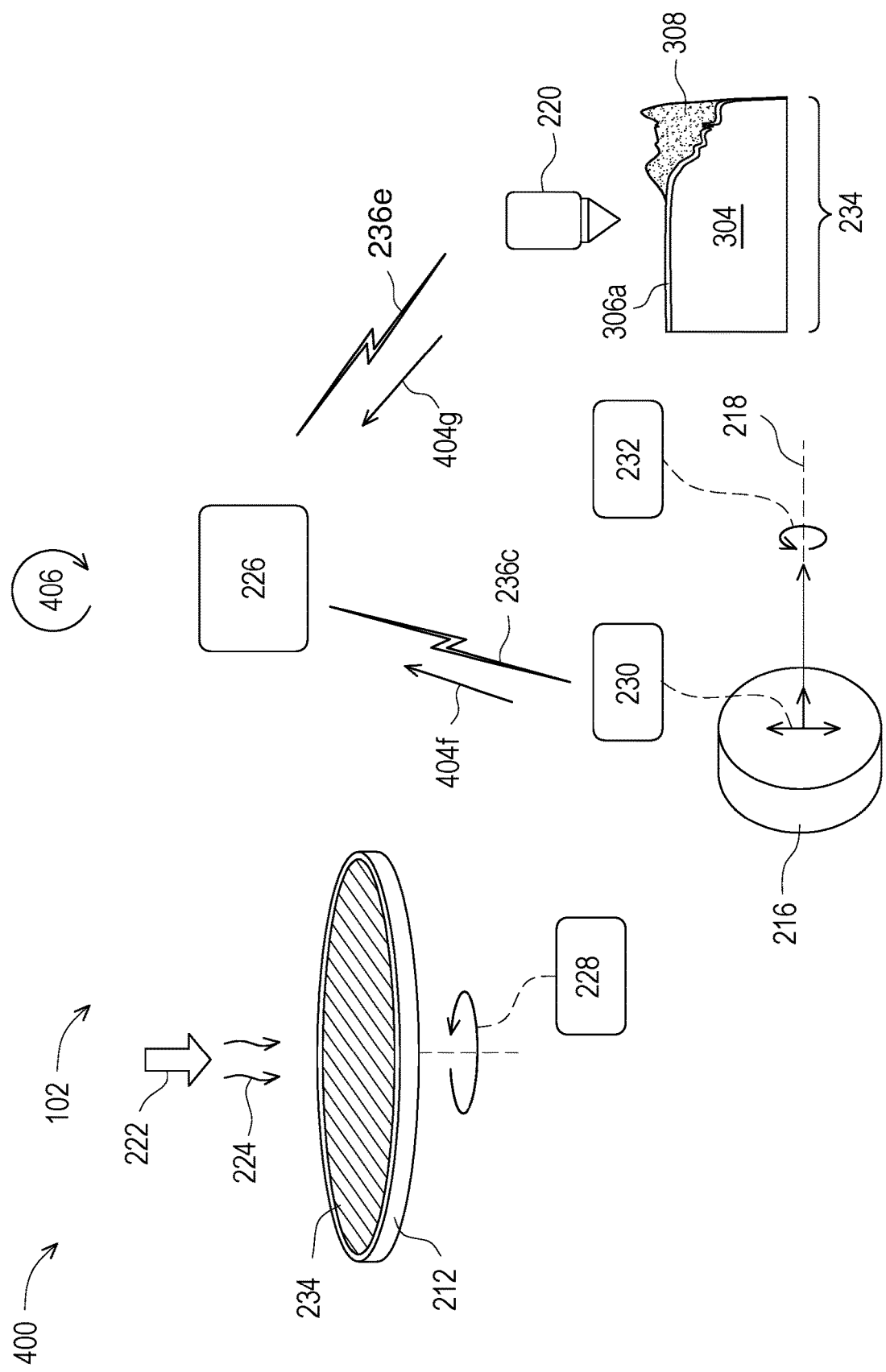

As shown in FIG. 4B, and subsequent to initiation of the edge-polishing operation, the controller 226 may perform an operation 406 that includes receiving a signal (e.g., an active-control feedback signal) from one or more of the actuator component 230 or the camera component 220.

For example, the controller 226 may receive a signal from the actuator component 230 using the communication link 236c. The signal from the actuator component 230 may include information 404f corresponding to a position of the ring-shaped polishing pad 216 along the horizontal axis 218 or a compressive force with which the ring-shaped polishing pad 216 is contacting the semiconductor substrate 234, among other examples.

Additionally, or alternatively, the controller 226 may receive a signal from the camera component 220 using the communication link 236d. The signal from the camera component 220 228 may include information 404g corresponding to an image of a perimeter region of semiconductor substrate 234, a topography of a surface of the layer of material 308, a topography of a surface of the layer of material 306a, a building up of the slurry material 224, or a buildup of one or more materials removed from the semiconductor substrate 234, among other examples.

As shown in FIG. 4C the controller 226 may perform an operation 408 to determine to adjust one or more parameters associated with the edge-polishing operation based on the information included in the signals received from one or more of the actuator component 230 (e.g., the information 404f) or the camera component 220 (e.g., the information 404g). For example, and based on the information, the controller 226 may determine to adjust one or more of the parameters corresponding to the rotational velocity of the platen 212 (e.g., the semiconductor substrate 234), the compressive force between the ring-shape polishing pad 216 and the semiconductor substrate 234, the rotational velocity of the ring-shaped polishing pad 216, the dispense rate of the slurry material 224, the mixture of the slurry material 224, or the position of the ring-shaped polishing pad 216 along the horizontal axis 218, among other examples.

Figure 4D:
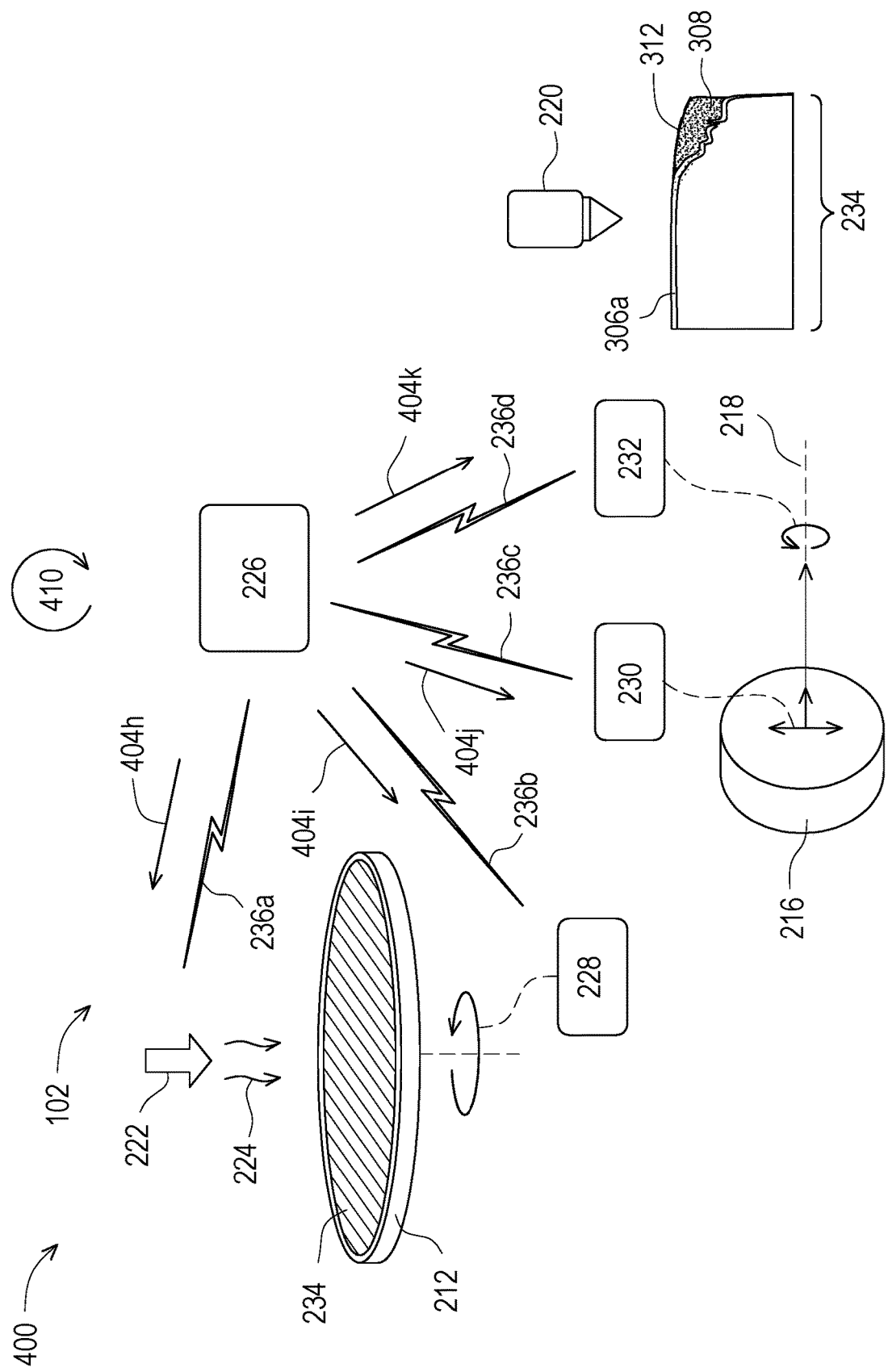

As shown in FIG. 4D, and as part of operation part of operation 410, the controller 226 may transmit one or more signals including information to adjust the one or more parameters of the edge polishing operation. For example, the controller 226 may transmit a signal to the slurry dispense component 222 using the communication link 236a. The signal to the slurry dispense component 222 may include information 404h corresponding to an adjusted setting to change a flow rate of the slurry material 224 from the slurry dispense component 222 or an adjusted setting to change a mixture of the slurry material 224 flowing from the slurry dispense component 222, among other examples.

Additionally, or alternatively, the controller 226 may transmit a signal to the platen motor component 228 using the communication link 236b. The signal to the platen motor component 228 may include information 404i corresponding to an adjusted setting to change a rotational profile (e.g., a rotational velocity, a rotational direction, or rotational acceleration, among other examples) of the platen motor component 228 (e.g., the platen 212 or the semiconductor substrate 234) about the vertical axis 214, among other examples.

Additionally, or alternatively, the controller 226 may transmit a signal to the actuator component 230 using the communication link 236c. The signal to the actuator component 230 may include information 404j corresponding to an adjusted setting to change a radial location of the ring-shaped polishing pad 216 along the horizontal axis 218, an adjusted setting to engage or disengage the ring-shaped polishing pad 216 and the semiconductor substrate 234, or a setting to adjust the force with which the ring-shaped polishing pad 216 engages the semiconductor substrate 234, among other examples Additionally, or alternatively, the controller 226 may transmit a signal to the polishing pad motor component 232 using the communication link 236d. The signal to the polishing pad motor component 232 may include information 404k corresponding to an adjusted setting to change a rotational profile (e.g., a rotational velocity, a rotational direction, or rotational acceleration, among other examples) of the ring-shaped polishing pad 216 about the horizontal axis 218, among other examples.

The controller 226 may determine one or more settings associated with one or more of the information 404a-404e using a machine learning model. Additionally, or alternatively, the controller 226 may determine one or more of the adjusted settings associated with the information 404h-404k using the machine learning model. The machine learning model may include and/or may be associated with one or more of a neural network model, a random forest model, a clustering model, or a regression model. In some implementations, the controller 226 uses the machine learning model to determine the one or more settings, and/or the one or more adjusted settings, by providing candidate settings and/or candidate adjusted settings as inputs to the machine learning model, and using the machine learning model to determine a likelihood, probability, or confidence that a particular outcome (e.g., the roll-off profile 312 satisfies a threshold for an edge-polishing operation) will be achieved using the candidate settings or adjusted settings. In some implementations, the controller 226 provides parameters associated with the incoming semiconductor substrate 234 (e.g., a deposition recipe used to form the layer of the material 308 or profile measurements of the layer of the material 308, among other examples) as input to the machine learning model, and the controller 226 uses the machine learning model to determine or identify a particular combination of settings or adjusted settings that are likely to achieve the roll-off profile 312.

The controller 226 (or another system) may train, update, and/or refine the machine learning model to increase the accuracy of the outcomes and/or parameters determined using the machine learning model. The controller 226 may train, update, and/or refine the machine learning model based on feedback and/or results from the subsequent edge-polishing operation, as well as from historical or related planarizing operations (e.g., from hundreds, thousands, or more historical or related edge-polishing or CMP operations) performed by the CMP tool 102.

For example, the controller 226 may determine a correlation between two or more of a material at or near a perimeter region of the semiconductor substrate 234 (e.g., the layer of the material 308), a removal rate of the material, a profile of the material, a rotational velocity of the platen 212, a rotational velocity of the ring-shaped polishing pad 216, a dispense rate of a slurry material 224 onto the semiconductor substrate 234, or a mixture of the slurry material 224, among other examples. In some implementations, the controller 226 provides information relating to the correlation to update the machine-learning model to estimate a profile of a roll-off region (e.g., the roll-off profile 312) at or near the perimeter region of the semiconductor substrate 234.

The number and arrangement of devices shown in FIGS. 4A-4D are provided as one or more examples. In practice, there may be additional devices, fewer devices, different devices, or differently arranged devices than those shown in FIGS. 4A-4D. Furthermore, two or more devices shown in FIGS. 4A-4D may be implemented within a single device, or a single device shown in FIGS. 4A-4D may be implemented as multiple, distributed devices. Additionally, or alternatively, a set of devices (e.g., one or more of the components of FIGS. 4A-4D) shown in FIGS. 4A-4D may perform one or more functions described as being performed by another set of devices shown in FIGS. 4A-4D.

Figure 5:
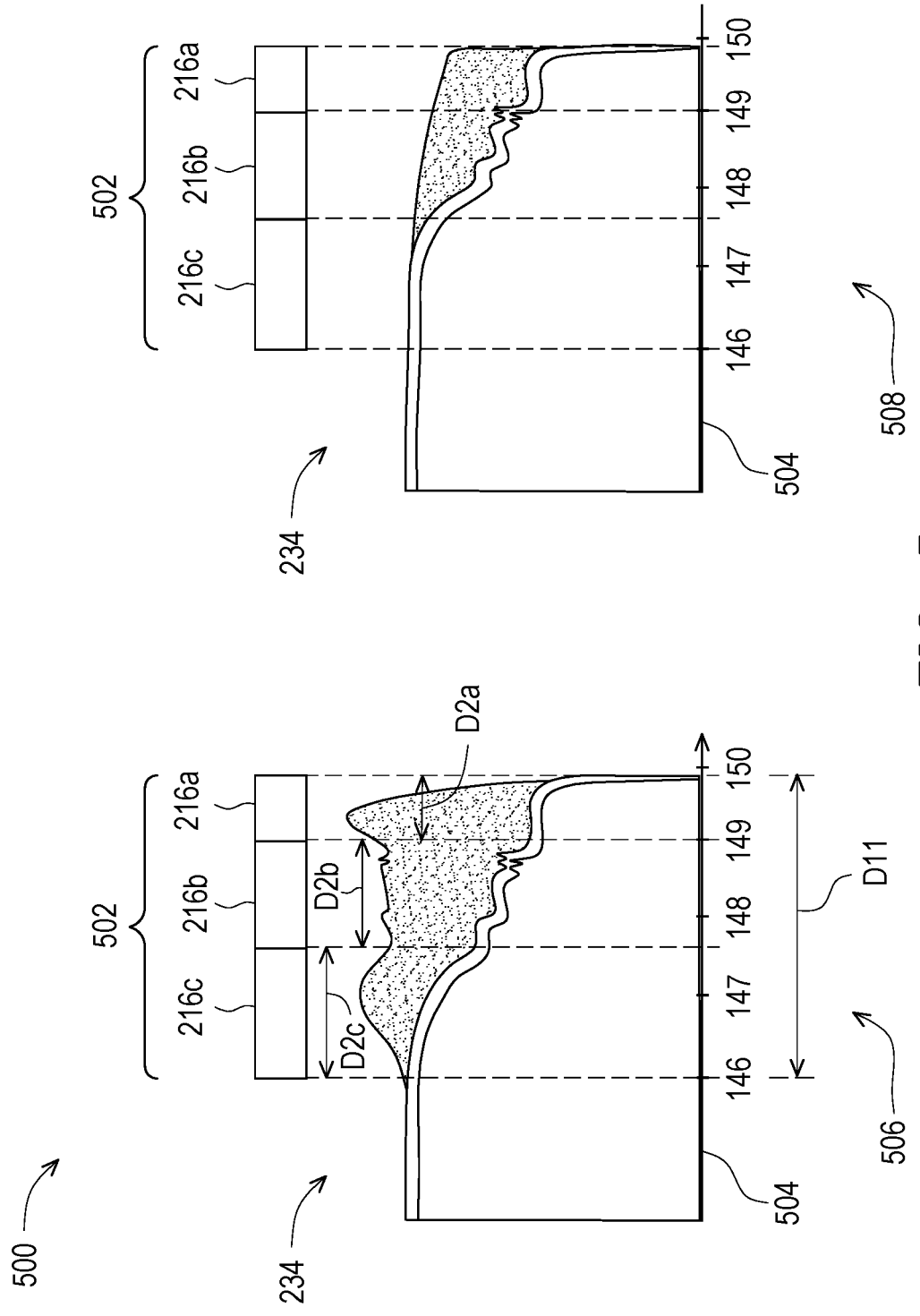

FIG. 5 is a diagram of an example implementation 500 described herein. The implementation 500 show a side view of an example perimeter region 502 of the semiconductor substrate 234. FIG. 5 shows one or more positions 504 that correspond to radial distance in millimeters (mm) from a central axis of the semiconductor substrate 234 (e.g., the vertical axis 214). In FIG. 5, the semiconductor substrate 234 may include an approximate diameter of 300 mm, and the values shown for the one or more positions 504 (e.g., 146, 147, 148, 149, and 150) may be associated with the corresponding radial distance from the central axis (e.g., up to 150 mm). However, other approximate diameters of the semiconductor substrate 234 (e.g., 200 millimeters or 400 millimeters, among other examples) values for the one or more positions 504 are within the scope of the present disclosure.

As shown in example 506, the perimeter region 502 corresponds to an approximate outer-most 4 radial millimeters of the semiconductor substrate 234. In other words, the perimeter region 502 corresponds to annular-shaped portion at an edge of the semiconductor substrate 234, where a width D11 of the annular-shaped portions is included in range of approximately 3.6 millimeters to approximately 4.4. millimeters. If the width D11 is less than approximately 3.6 millimeters, a manufacturing yield of integrated circuit (IC) devices at or near edges of the semiconductor substrate 234 may be decreased to increase an amount of resources needed to manufacture the IC devices. If the width D11 is greater than approximately 4.4 millimeters, a die count of the semiconductor substrate 234 (e.g., die-per-wafer, or DPW) may be decreased to increase an amount of resources and/or materials needed to manufacture the IC devices. However, other values for the width D11 are within the scope of the present disclosure.

The ring-shaped polishing pads 216a-216c may each have a different width (e.g., corresponding to the width D2 of FIG. 2B). For example, and as shown in example 506, the ring-shaped polishing pad 216*a* may have a width D2*a* of approximately 1 millimeter, the ring-shaped polishing pad 216*b* may have a width D2*b* of approximately 1.3 millimeters, and ring-shaped polishing pad 216*c* may have a width D2*c* of approximately 1.7 millimeters. Additionally, or alternatively the widths D2*a*-D2*c* may be configured such that polishing regions "overlap". Additionally, or alternatively, positions of the polishing pads 216*a*-216*c* within the perimeter region 502 may be adjusted by an actuator component (e.g., by the actuator component 230).

As shown in example 508, and as described in connection with FIGS. 4A-4D and elsewhere herein, the polishing pads 216*a*-216*c* may be actively controlled by a controller of a CMP tool (e.g., the controller 226 of the CMP tool 102) to perform an edge-polishing operation within the perimeter region 502. Such an edge-polishing operation may form the roll-off profile 312 within the perimeter region 502.

As indicated above, FIG. 5 is provided as an example. Other examples may differ from what is described with regard to FIG. 5.

Figure 6:
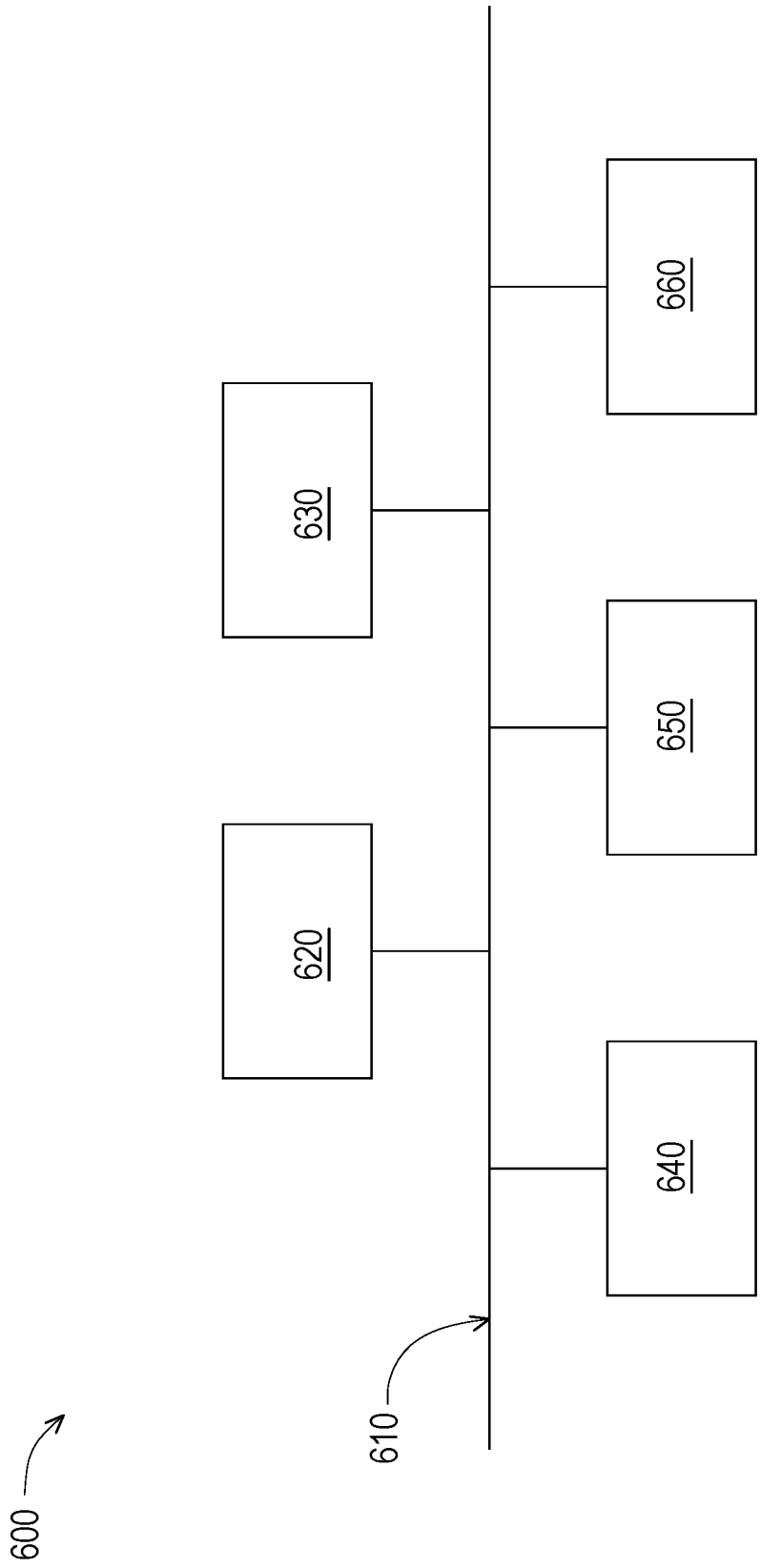
FIG. 6 is a diagram of example components of one or more devices of FIGS. 1 and 2A-2D described herein.

FIG. 6 is a diagram of example components of a device 600, which may correspond to the controller 226. In some implementations, the semiconductor processing tools 102-106 include one or more devices 600 and/or one or more components of device 600. In some implementations, the camera component 220, the slurry dispense component 222, the platen motor component 228, the actuator component 230, or the polishing pad motor component 232 include one or more devices 600 and/or one or more components of device 600. As shown in FIG. 6, device 600 may include a bus 610, a processor 620, a memory 630, an input component 640, an output component 650, and a communication component 660.

Bus 610 includes one or more components that enable wired and/or wireless communication among the components of device 600. Bus 610 may couple together two or more components of FIG. 6, such as via operative coupling, communicative coupling, electronic coupling, and/or electric coupling. Processor 620 includes a central processing unit, a graphics processing unit, a microprocessor, a controller, a microcontroller, a digital signal processor, a field-programmable gate array, an application-specific integrated circuit, and/or another type of processing component. Processor 620 is implemented in hardware, firmware, or a combination of hardware and software. In some implementations, processor 620 includes one or more processors capable of being programmed to perform one or more operations or processes described elsewhere herein.

Memory 630 includes volatile and/or nonvolatile memory. For example, memory 630 may include random access memory (RAM), read only memory (ROM), a hard disk drive, and/or another type of memory (e.g., a flash memory, a magnetic memory, and/or an optical memory). Memory 630 may include internal memory (e.g., RAM, ROM, or a hard disk drive) and/or removable memory (e.g., removable via a universal serial bus connection). Memory 630 may be a non-transitory computer-readable medium. Memory 630 stores information, instructions, and/or software (e.g., one or more software applications) related to the operation of device 600. In some implementations, memory 630 includes one or more memories that are coupled to one or more processors (e.g., processor 620), such as via bus 610.

Input component 640 enables device 600 to receive input, such as user input and/or sensed input. For example, input component 640 may include a touch screen, a keyboard, a keypad, a mouse, a button, a microphone, a switch, a sensor, a global positioning system sensor, an accelerometer, a gyroscope, and/or an actuator component. Output component 650 enables device 600 to provide output, such as via a display, a speaker, and/or a light-emitting diode. Communication component 660 enables device 600 to communicate with other devices via a wired connection and/or a wireless connection. For example, communication component 660 may include a receiver, a transmitter, a transceiver, a modem, a network interface card, and/or an antenna.

Device 600 may perform one or more operations or processes described herein. For example, a non-transitory computer-readable medium (e.g., memory 630) may store a set of instructions (e.g., one or more instructions or code) for execution by processor 620. Processor 620 may execute the set of instructions to perform one or more operations or processes described herein. In some implementations, execution of the set of instructions, by one or more processors 620, causes the one or more processors 620 and/or the device 600 to perform one or more operations or processes described herein. In some implementations, hardwired circuitry is used instead of or in combination with the instructions to perform one or more operations or processes described herein. Additionally, or alternatively, processor 620 may be configured to perform one or more operations or processes described herein. Thus, implementations described herein are not limited to any specific combination of hardware circuitry and software.

The number and arrangement of components shown in FIG. 6 are provided as an example. Device 600 may include additional components, fewer components, different components, or differently arranged components than those shown in FIG. 6. Additionally, or alternatively, a set of components (e.g., one or more components) of device 600 may perform one or more functions described as being performed by another set of components of device 600.

Figure 7:
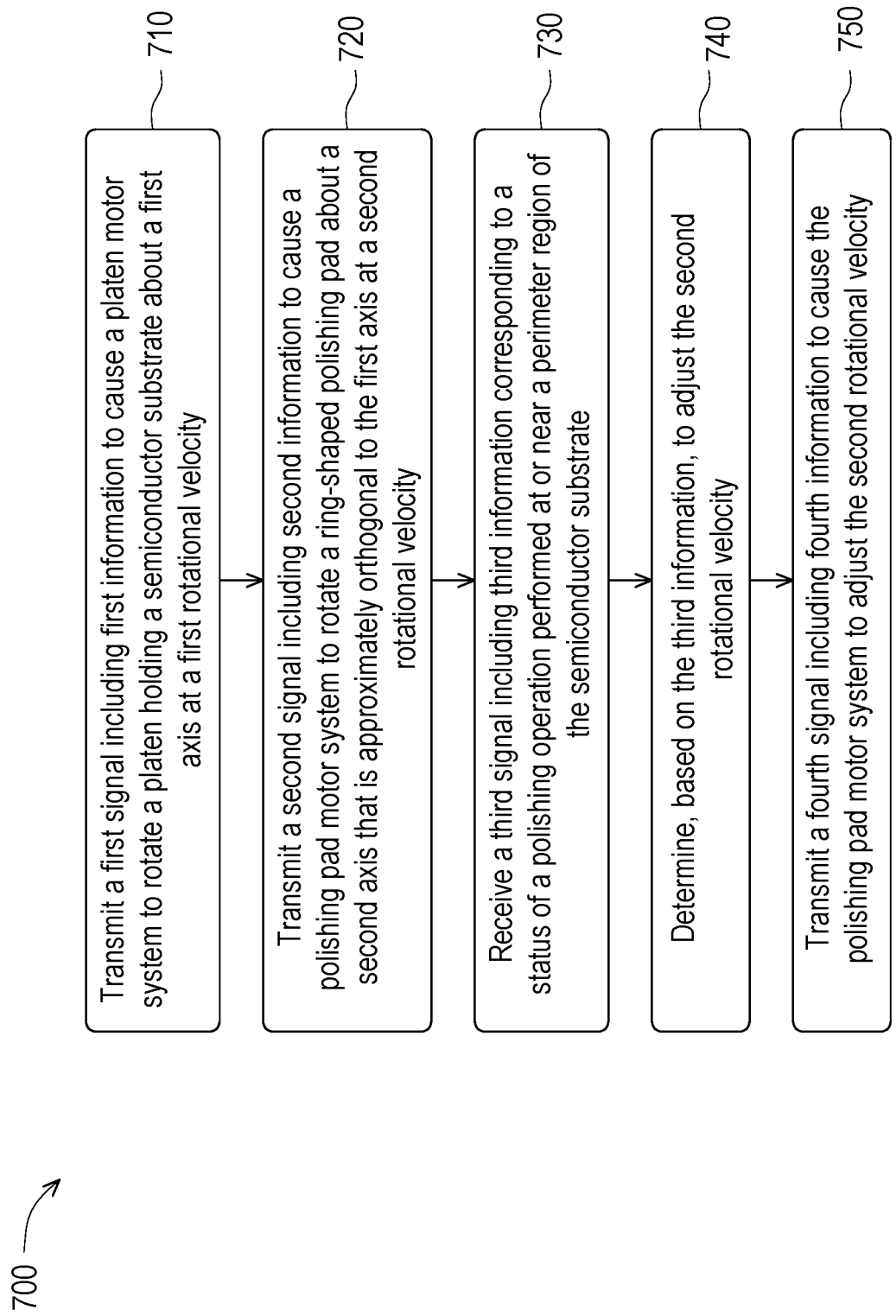
FIGS. 7 and 8 are flowcharts of example processes associated with techniques using the CMP tool described herein.

FIG. 7 is a flowchart of an example process 700 associated with techniques using the CMP tool 102 described herein. In some implementations, one or more process blocks of FIG. 7 are performed by the controller 226. In some implementations, one or more process blocks of FIG. 7 are performed by another device or a group of devices separate from or including the controller 226, such as the CMP tool 102, the camera component 220, the platen motor component 228, the actuator component 230, or the polishing pad motor component 232. Additionally, or alternatively, one or more process blocks of FIG. 7 may be performed by one or more components of device 600, such as processor 620, memory 630, input component 640, output component 650, and/or communication component 660.

As shown in FIG. 7, process 700 may include transmitting a first signal including first information to cause a platen motor component to rotate a platen holding a semiconductor substrate about a first axis at a first rotational velocity (block 710). For example, the controller 226 may transmit a first signal including first information (e.g., the information 404*b*) to cause a platen motor component 228 to rotate a platen 212 holding a semiconductor substrate 234 about a first axis (e.g., the vertical axis 214) at a first rotational velocity, as described above.

As further shown in FIG. 7, process 700 may include transmitting a second signal including second information to cause a polishing pad motor component to rotate a ring-shaped polishing pad about a second axis that is approximately orthogonal to the first axis at a second rotational velocity (block 720). For example, the controller 226 may transmit a second signal including second information (e.g., the information 404*d*) to cause a polishing pad motor component 232 to rotate a ring-shaped polishing pad 216 about a second axis (e.g., the horizontal axis 218) that is approximately orthogonal to the first axis at a second rotational velocity, as described above.

As further shown in FIG. 7, process 700 may include receiving, from a camera component, a third signal including third information corresponding to a status of a polishing operation performed at or near a perimeter region of the semiconductor substrate (block 730). For example, the controller 226 may receive, from a camera component 220, a third signal including third information (e.g., the information 404g) corresponding to a status of a polishing operation performed at or near a perimeter region 502 of the semiconductor substrate 234, as described above.

As further shown in FIG. 7, process 700 may include determining, based on the third information, to adjust the second rotational velocity (block 740). For example, the controller 226 may determine, based on the third information, to adjust the second rotational velocity, as described above.

As further shown in FIG. 7, process 700 may include transmitting a fourth signal including fourth information to cause the polishing pad motor component to adjust the second rotational velocity (block 750). For example, the controller 226 may transmit a fourth signal including fourth information (e.g., the information 404k) to cause the polishing pad motor component 232 to adjust the second rotational velocity, as described above.

Process 700 may include additional implementations, such as any single implementation or any combination of implementations described below and/or in connection with one or more other processes described elsewhere herein.

In a first implementation, process 700 includes receiving a fifth signal including fifth information (e.g., the information 404) corresponding to a compressive force between the ring-shaped polishing pad 216 and a surface of the perimeter region 502 of the semiconductor substrate 234, determining, based on the fifth information in combination with the third information, to adjust the compressive force, and transmitting a sixth signal including sixth information (e.g., the information 404j) to cause an actuator component 230 to adjust the compressive force.

In a second implementation, alone or in combination with the first implementation, transmitting the fourth signal including the fourth information to cause the polishing pad motor component 232 to adjust the second rotational velocity includes transmitting the fourth signal to cause the polishing pad motor component 232 to adjust the second rotational velocity to a third rotational velocity that is greater relative to a fourth rotational velocity of another ring-shaped polishing pad performing a portion of the polishing operation.

In a third implementation, alone or in combination with one or more of the first and second implementations, transmitting the fourth signal to cause the polishing pad motor component 232 to adjust the second rotational velocity includes transmitting the fourth signal to cause the polishing pad motor component to adjust the second rotational velocity to a third rotational velocity that is lesser relative to a fourth rotational velocity of another ring-shaped polishing pad performing a portion of the polishing operation.

In a fourth implementation, alone or in combination with one or more of the first through third implementations, process 700 includes determining a correlation between two or more of a material (e.g., the layer of the material 308) at or near a perimeter region 502 of the semiconductor substrate 234, a removal rate of the material, a profile of the material, the first rotational velocity, the second rotational velocity, a dispense rate of a slurry material 224 onto the semiconductor substrate 234, or a mixture of the slurry, and providing fifth information relating to the correlation to update a machine-learning model that estimates a profile of a roll-off region (e.g., the roll-off profile 312) at or near the perimeter region 502 of the semiconductor substrate 234.

In a fifth implementation, alone or in combination with one or more of the first through fourth implementations, process 700 includes determining, based on the third information, to adjust the first rotational velocity, and transmitting a fifth signal including fifth information (e.g., the information 404i) to cause the platen motor component 228 to adjust the first rotational velocity.

In a sixth implementation, alone or in combination with one or more of the first through fifth implementations, process 700 includes determining, based on the third information, to adjust one or more of a mixture of a slurry material 224 being dispensed on the semiconductor substrate 234 or a dispense rate of the slurry material 224, and transmitting a fifth signal including fifth information (e.g., the information 404h) to cause a slurry dispense component 222 to adjust one or more of a mixture of the slurry material 224 or a dispense rate of the slurry material 224.

Although FIG. 7 shows example blocks of process 700, in some implementations, process 700 includes additional blocks, fewer blocks, different blocks, or differently arranged blocks than those depicted in FIG. 7. Additionally, or alternatively, two or more of the blocks of process 700 may be performed in parallel.

Figure 8:
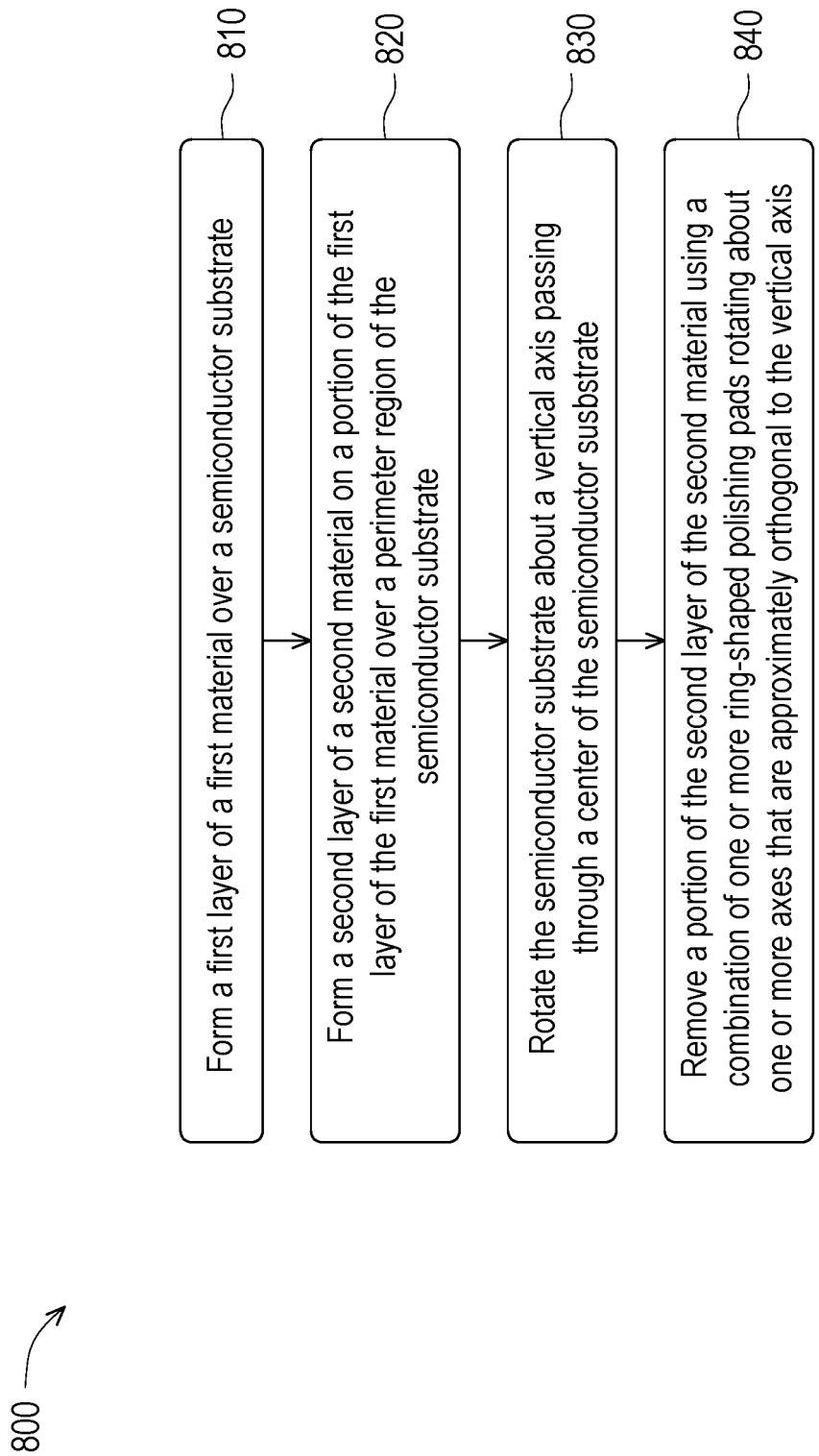

FIG. 8 is a flowchart of an example process 800 associated with techniques using the CMP tool 102 described herein. In some implementations, one or more process blocks of FIG. 8 are performed by one or more of the semiconductor processing tools 102-106. Additionally, or alternatively, one or more process blocks of FIG. 8 may be performed by one or more components of device 600, such as processor 620, memory 630, input component 640, output component 650, and/or communication component 660.

As shown in FIG. 8, process 800 may include forming a first layer of a first material over a semiconductor substrate (block 810). For example, the one or more of the semiconductor processing tools, such as the deposition tool 104, may form a first layer of a first material (e.g., the layer of the material 306a) over a semiconductor substrate 234, as described above.

As further shown in FIG. 8, process 800 may include forming a second layer of a second material on a portion of the first layer of the first material over a perimeter region of the semiconductor substrate (block 820). For example, the one or more of the semiconductor processing tools, such as the deposition tool 104, may form a second layer of a second material (e.g., the layer of the material 308) on a portion of the first layer of the first material over a perimeter region 502 of the semiconductor substrate 234, as described above.

As further shown in FIG. 8, process 800 may include rotating the semiconductor substrate about a vertical axis passing through a center of the semiconductor substrate (block 830). For example, the one or more of the semiconductor processing tools, such as the CMP tool 102 (e.g., the platen motor component 228 in combination with the platen 212) may rotate the semiconductor substrate 234 about a vertical axis 214 passing through a center of the semiconductor substrate 234, as described above.

As further shown in FIG. 8, process 800 may include removing a portion of the second layer of the second material using a combination of one or more ring-shaped polishing pads rotating about one or more axes that are approximately orthogonal to the vertical axis (block 840). For example, the one or more of the semiconductor processing tools, such as the CMP tool 102, may remove a portion of the second layer of the second material using a combination of one or more ring-shaped polishing pads (e.g., the ring-shaped polishing pads 216a-216c) rotating about one or more axes (e.g., the horizontal axes 218a-218c) that are approximately orthogonal to the vertical axis, as described above.

Process 800 may include additional implementations, such as any single implementation or any combination of implementations described below and/or in connection with one or more other processes described elsewhere herein.

In a first implementation, forming the first layer of the material 306a includes depositing an oxide material at a thickness D7 that is included in a range of approximately 900 angstroms to approximately 1100 angstroms.

In a second implementation, alone or in combination with the first implementation, forming the second layer of the second material includes depositing an oxide material at a thickness D8 that is included in a range of approximately 17,100 angstroms to approximately 20,900 angstroms.

In a third implementation, alone or in combination with one or more of the first and second implementations, removing the portion of the second layer of the second material includes removing an amount of the second layer of the second material that is included in a range of approximately 13,500 angstroms to approximately 16,500 angstroms.

In a fourth implementation, alone or in combination with one or more of the first through third implementations, removing the portion of the second layer of the second material includes removing the portion of the second layer of the second material from the perimeter region 508 of the semiconductor substrate, where the perimeter region of the semiconductor substrate corresponds to an approximate outer-most 5 radial millimeters of the semiconductor substrate.

In a fifth implementation, alone or in combination with one or more of the first through fourth implementations, removing the portion of the second layer of the second material excludes removing a portion of the first layer of the material.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

Some implementations described herein provide techniques and apparatuses for polishing a perimeter region of a semiconductor substrate so that a roll-off profile at or near the perimeter region of the semiconductor substrate satisfies a threshold. The described implementations include depositing a first layer of a first oxide material across the semiconductor substrate followed by depositing a second layer of a second oxide material over the first layer of the first oxide material and around a perimeter region of the semiconductor substrate. The described implementations further include polishing the second layer of the second oxide material over the perimeter region using a CMP tool including one or more ring-shaped polishing pads oriented vertically over the perimeter region.

Techniques using the CMP tool including the one or more ring-shaped polishing pads allow for a focused and a controlled polishing of the second layer of the second oxide material over the perimeter region of the semiconductor substrate to tightly control the roll-off profile. Additionally, the techniques enable an amount of the first layer of the first oxide material deposited across the semiconductor substrate to be reduced relative to techniques using a CMP tool not including the ring-shape polishing pads. Additionally, the techniques may increase a throughput of a deposition tool depositing the first layer of the first oxide material and increase a throughput of the CMP tool.

In this way, a roll-off profile of the semiconductor substrate may be consistently formed to improve a yield of semiconductor substrates used for a multi-wafer stacking process. Additionally, an amount or resources needed to fabricate the semiconductor substrate, including semiconductor processing tool resources and power resources, may be reduced relative to techniques that polish the perimeter region of the semiconductor substrate using horizontally-oriented polishing pads.

As described in greater detail above, some implementations described herein provide a CMP tool. The CMP tool includes a platen configured to rotate a semiconductor substrate about a vertical axis at a first rotational velocity. The CMP tool includes a ring-shaped polishing pad configured to rotate about a horizontal axis that is approximately orthogonal to the vertical axis at a second rotational velocity. The CMP tool includes a motor system mechanically-coupled to the ring-shaped polishing pad. The CMP tool includes a camera component. The CMP tool includes a controller configured, receive, from the camera component, a first signal including first information corresponding to a status of a polishing operation performed at or near a perimeter region of the semiconductor substrate. The controller is configured to determine, based on the first information, to adjust the second rotational velocity of the ring-shaped polishing pad and transmit, to the motor system, a second signal including second information to cause the motor system to adjust the second rotational velocity.

As described in greater detail above, some implementations described herein provide a method. The method includes transmitting, by a controller, a first signal including first information to cause a platen motor component to rotate a platen holding a semiconductor substrate about a first axis at a first rotational velocity. The method includes transmitting, by the controller, a second signal including second information to cause a polishing pad motor component to rotate a ring-shaped polishing pad about a second axis that is approximately orthogonal to the first axis at a second rotational velocity. The method includes receiving, by the controller and from a camera component, a third signal including third information corresponding to a status of a polishing operation performed at or near a perimeter region of the semiconductor substrate. The method includes determining, by the controller and based on the third information, to adjust the second rotational velocity. The method includes transmitting, by the controller, a fourth signal including fourth information to cause the polishing pad motor component to adjust the second rotational velocity.

As described in greater detail above, some implementations described herein provide a method. The method includes forming a first layer of a first material over a semiconductor substrate. The method includes forming a second layer of a second material on a portion of the first layer of the first material over a perimeter region of the semiconductor substrate. The method includes rotating the semiconductor substrate about a vertical axis. The method includes removing a portion of the second layer of the second material using a combination of one or more ring-shaped polishing pads rotating about one or more axes that are approximately orthogonal to the vertical axis.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical mechanical planarization tool comprising:
a platen configured to rotate a semiconductor substrate about a vertical axis at a first rotational velocity;
a ring-shaped polishing pad configured to rotate about a horizontal axis that is approximately orthogonal to the vertical axis at a second rotational velocity:
a polishing pad motor component mechanically-coupled to the ring-shaped polishing pad;
a camera component; and
a controller configured to:
receive, from the camera component, a first signal including first information corresponding to a status of a polishing operation performed at or near a perimeter region of the semiconductor substrate;
determine, based on the first information, to adjust the second rotational velocity of the ring-shaped polishing pad;
transmit, to the polishing pad motor component, a second signal including second information to cause the polishing pad motor component to adjust the second rotational velocity; and
initiate a first rotational motion of the semiconductor substrate at the first rotational velocity and initiate a second rotational motion of the ring-shaped polishing pad at the second rotational velocity based on an incoming roll off profile of the semiconductor substrate.

2. The chemical mechanical planarization tool of claim 1, wherein the ring-shaped polishing pad corresponds to a first ring-shaped polishing pad and the horizontal axis corresponds to a first horizontal axis and further comprising:
one or more additional ring-shaped polishing pads configured to rotate about one or more additional horizontal axes that are approximately orthogonal to the vertical axis.

3. The chemical mechanical planarization tool of claim 2, wherein a first radial distance of the first ring-shaped polishing pad from the vertical axis is greater relative to a second radial distance of a second polishing pad.

4. The chemical mechanical planarization tool of claim 3, wherein a third radial distance of a third ring-shaped polishing pad is greater relative to the second radial distance of the second polishing pad.

5. The chemical mechanical planarization tool of claim 1, further comprising:
an actuator component mechanically-coupled to the ring-shaped polishing pad, and
wherein the controller is further configured to:
determine, based on the first information, to adjust a radial location of the ring-shaped polishing pad relative to the vertical axis, and
transmit, to the actuator component, a third signal including third information to cause the actuator component to adjust the radial location.

6. The chemical mechanical planarization tool of claim 1, further comprising:
an actuator component mechanically-coupled to the ring-shaped polishing pad, and
wherein the controller is further configured to:
determine, based on the first information, to adjust a compressive force with which the ring-shaped polishing pad contacts a surface of the semiconductor substrate, and
transmit, to the actuator component, a third signal including third information to cause the actuator component to adjust the compressive force.

7. The chemical mechanical planarization tool of claim 1, wherein the polishing operation removes a portion of a first material that is on a second material and that is over the perimeter region.

8. A method, comprising:
transmitting, by a controller, a first signal including first information to cause a platen motor component to rotate a platen holding a semiconductor substrate about a first axis at a first rotational velocity;
transmitting, by the controller, a second signal including second information to cause a polishing pad motor component to rotate a ring-shaped polishing pad about a second axis that is approximately orthogonal to the first axis at a second rotational velocity;
receiving, by the controller and from a camera component, a third signal including third information corresponding to a status of a polishing operation performed at or near a perimeter region of the semiconductor substrate;
determining, by the controller based on the third information, to adjust the first rotational velocity and the second rotational velocity;
transmitting, by the controller, a fourth signal including fourth information to cause the polishing pad motor component to adjust the second rotational velocity; and
transmitting, by the controller, a fifth signal including fifth information to cause the platen motor component to adjust the first rotational velocity.

9. The method of claim 8, further comprising:
receiving a sixth signal including sixth information corresponding to a compressive force between the ring-shaped polishing pad and a surface of the perimeter region of the semiconductor substrate;
determining, based on the sixth information in combination with the third information, to adjust the compressive force; and
transmitting a sixth signal including sixth information to cause an actuator component to adjust the compressive force.

10. The method of claim 8, wherein transmitting the fourth signal including the fourth information to cause the polishing pad motor component to adjust the second rotational velocity comprises:
transmitting the fourth signal to cause the polishing pad motor component to adjust the second rotational velocity to a third rotational velocity that is greater relative to a fourth rotational velocity of another ring-shaped polishing pad performing a portion of the polishing operation.

11. The method of claim 8, wherein transmitting the fourth signal to cause the polishing pad motor component to adjust the second rotational velocity comprises:

transmitting the fourth signal to cause the polishing pad motor component to adjust the second rotational velocity to a third rotational velocity that is lesser relative to a fourth rotational velocity of another ring-shaped polishing pad performing a portion of the polishing operation.

12. The method of claim 8, further comprising:

determining a correlation between two or more of a material at or near the perimeter region of the semiconductor substrate, a removal rate of the material, a profile of the material, the first rotational velocity, the second rotational velocity, a dispense rate of a slurry onto the semiconductor substrate, or a mixture of the slurry, and providing sixth information relating to the correlation to update a machine-learning model that estimates a profile of a roll-off region at or near the perimeter region of the semiconductor substrate.

13. The method of claim 8, wherein the first axis passes through a center of the semiconductor substrate.

14. The method of claim 8, further comprising:

determining, based on the third information, to adjust one or more of a mixture of a slurry material being dispensed on the semiconductor substrate or a dispense rate of the slurry material; and transmitting a sixth signal including sixth information to cause a slurry dispense component to adjust one or more of the mixture of the slurry material or the dispense rate of the slurry material.

15. A method, comprising:

forming a first layer of a first material over a semiconductor substrate;

forming a second layer of a second material on a portion of the first layer of the first material over a perimeter region of the semiconductor substrate;

rotating the semiconductor substrate about a vertical axis passing through a center of the semiconductor substrate; and removing a portion of the second layer of the second material using a combination of one or more ring-shaped polishing pads rotating about one or more axes that are approximately orthogonal to the vertical axis.

16. The method of claim 15, wherein forming the first layer of the first material comprises:

depositing an oxide material at a thickness that is included in a range of approximately 900 angstroms to approximately 1100 angstroms.

17. The method of claim 15, wherein forming the second layer of the second material comprises:

depositing an oxide material at a thickness that is included in a range of approximately 17,100 angstroms to approximately 20,900 angstroms.

18. The method of claim 15, wherein removing the portion of the second layer of the second material comprises:

removing an amount of the second layer of the second material that is included in a range of approximately 13,500 angstroms to approximately 16,500 angstroms.

19. The method of claim 15, wherein removing the portion of the second layer of the second material comprises:

removing the portion of the second layer of the second material from the perimeter region of the semiconductor substrate, wherein the perimeter region of the semiconductor substrate corresponds to annular-shaped portion at an edge of the semiconductor substrate, and wherein a width of the annular-shaped portion is included in a range of approximately 3.6 millimeters to approximately 4.4 millimeters.

20. The method of claim 15, wherein removing the portion of the second layer of the second material excludes:

removing a portion of the first layer of the first material.

\* \* \* \* \*